(12) United States Patent
Ide et al.

(10) Patent No.: US 10,678,864 B2
(45) Date of Patent: Jun. 9, 2020

(54) ANALYSIS MODEL PREPARING SYSTEM, PROGRAMMING APPARATUS, AND ANALYSIS MODEL PREPARING METHOD

(71) Applicant: HITACHI, LTD., Tokyo (JP)

(72) Inventors: Takaya Ide, Tokyo (JP); Hiroshi Nasu, Tokyo (JP); Yuki Naganuma, Tokyo (JP); Toshio Nishida, Tokyo (JP); Hideki Nakamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/135,516

(22) Filed: Sep. 19, 2018

(65) Prior Publication Data
US 2019/0220549 A1 Jul. 18, 2019

(30) Foreign Application Priority Data
Jan. 17, 2018 (JP) ................................ 2018-005861

(51) Int. Cl.
*G06F 9/44* (2018.01)
*G06F 16/904* (2019.01)
*G06F 8/10* (2018.01)
*G06F 9/451* (2018.01)
*G06F 12/0875* (2016.01)
(Continued)

(52) U.S. Cl.
CPC .............. *G06F 16/904* (2019.01); *G06F 8/10* (2013.01); *G06F 8/35* (2013.01); *G06F 8/71* (2013.01); *G06F 9/451* (2018.02); *G06F 12/0875* (2013.01); *G06F 16/907* (2019.01); *G06F 30/00* (2020.01)

(58) Field of Classification Search
CPC ...... G06F 9/451; G06F 12/0875; G06F 17/50; G06F 16/904; G06F 16/907; G06F 8/10; G06F 8/35; G06F 8/71; G06F 30/00
USPC ........................................................ 717/104
See application file for complete search history.

(56) References Cited

U.S. PATENT DOCUMENTS

| | | | | |
|---|---|---|---|---|
| 5,542,060 A | * | 7/1996 | Yoshida | G06F 9/30043 712/208 |
| 6,799,236 B1 | * | 9/2004 | Dice | G06F 9/52 710/200 |

(Continued)

FOREIGN PATENT DOCUMENTS

JP 2016-537755 A 12/2016

OTHER PUBLICATIONS

Title: Pin: building customized program analysis tools with dynamic instrumentation, author: Luk et al, published on 2005.*
(Continued)

*Primary Examiner* — Chameli Das
(74) *Attorney, Agent, or Firm* — Volpe and Koenig, P.C.

(57) ABSTRACT

An analysis model execution unit executing a part of an analysis model, an analysis model partial execution unit partially executing the analysis model based on intermediate data generated during execution of the analysis model, external storage storing the intermediate data and mapping information which is corresponding relationship between the intermediate data and the analysis model, and an analysis model general processing unit generating the mapping information by associating the intermediate data with the analysis model and reading the intermediate data associated with the analysis model from the external storage based on the mapping information are provided.

14 Claims, 17 Drawing Sheets

(51) Int. Cl.
    *G06F 8/71*         (2018.01)
    *G06F 16/907*     (2019.01)
    *G06F 8/35*         (2018.01)
    *G06F 30/00*      (2020.01)

(56) References Cited

U.S. PATENT DOCUMENTS

| | | | | |
|---|---|---|---|---|
| 7,505,879 | B2* | 3/2009 | Tomoyasu | H01J 37/32935 700/108 |
| 9,158,664 | B1* | 10/2015 | Aldrich | G06F 8/10 |
| 9,582,768 | B1* | 2/2017 | Englehart | G06F 30/00 |
| 9,665,350 | B1* | 5/2017 | Kalmar | H04L 1/244 |
| 2003/0140308 | A1* | 7/2003 | Murthy | G06F 16/86 715/234 |
| 2004/0031018 | A1* | 2/2004 | Marty | G06F 8/10 717/120 |
| 2005/0086653 | A1* | 4/2005 | Heishi | G06F 8/4442 717/151 |
| 2005/0152592 | A1* | 7/2005 | Kasai | G06T 7/0012 382/132 |
| 2006/0075291 | A1* | 4/2006 | Takahashi | G11B 20/1883 714/6.32 |
| 2006/0218540 | A1* | 9/2006 | Edwards | G06F 9/4484 717/146 |
| 2007/0067751 | A1* | 3/2007 | Seno | G06F 17/505 716/102 |
| 2007/0234281 | A1* | 10/2007 | Inouchi | G06F 8/75 717/104 |
| 2007/0288885 | A1* | 12/2007 | Brunel | G06F 8/10 717/104 |
| 2008/0178157 | A1* | 7/2008 | Winberg | G06F 8/41 717/128 |
| 2008/0263506 | A1* | 10/2008 | Broadfoot | G06F 8/10 717/104 |
| 2009/0204606 | A1* | 8/2009 | Osada | G06F 16/172 |
| 2010/0325618 | A1* | 12/2010 | Song | G06F 11/3624 717/143 |
| 2013/0179750 | A1* | 7/2013 | Hida | G06F 11/1044 714/763 |
| 2014/0082595 | A1* | 3/2014 | Van Gogh | G06F 11/3604 717/126 |
| 2015/0113513 | A1 | 4/2015 | Aggag et al. | |
| 2015/0193240 | A1* | 7/2015 | Ben-Itzhak | G06F 9/4406 718/100 |
| 2015/0357007 | A1* | 12/2015 | Manning | G06F 11/1048 714/763 |
| 2016/0065430 | A1* | 3/2016 | Hirahara | H04L 43/065 709/224 |
| 2017/0046142 | A1* | 2/2017 | Desineni | G06F 8/53 |
| 2018/0356800 | A1* | 12/2018 | Chao | G05B 19/41835 |

OTHER PUBLICATIONS

Title: Automatic mapping of task and data parallel programs for efficient execution on multicomputers author: J Subhlok, published on 1993.*

Title: Efficient microarchitecture modeling and path analysis for real-time software author: Yts Li et al, publshied on 1995.*

Open for Innovation KNIME, KNIME Quickstart Guide, pp. 1-25.

\* cited by examiner

FIG. 5

```
{
    {
        "id": "9dbc4b3b",
        "type": "file in",
        "name": "READ FILE (NORMAL DATA)",
        "filename": "/opt/data/nor.csv",
        "format": "utf8",
        "x": 160,
        "y": 90,
        "wires": [
            {
                "28602f3c"
            }
        ]
    },
    {
        "id": "c8dc722b",
        "type": "correlation_matrix",
        "name": "CORRELATION MATRIX",
        "x": 340,
        "y": 90,
        "wires": [
            {
                "451db713"
            }
        ]
    },
    ...
}
```

FIG. 6

| REVISION ID | NODE ID | INTERMEDIATE DATA STORAGE LOCATION |
|---|---|---|
| e07b69fe | 9dbc4b3b | https://sample.storage.com/e07b69fe.9dbc4b3b |
| | c8dc722b | https://sample.storage.com/e07b69fe.c8dc722b |
| | ⋮ | ⋮ |
| 22dc2a88 | 37a59414 | https://sample.storage.com/22dc2a88.37a59414 |
| | c8dc722b | https://sample.storage.com/22dc2a88.c8dc722b |
| | ⋮ | ⋮ |
| 096b3534 | None | None |
| ⋮ | ⋮ | ⋮ |

MAPPING INFORMATION /16

*17 ANALYSIS MODEL META INFORMATION*

| REVISION ID | ANALYSIS MODEL NAME | DESCRIPTION | REGISTERED TIME | DATA AMOUNT |
|---|---|---|---|---|
| e07b69fe | CORRELATION ANALYSIS | AFTER CALCULATING CORRELATION MATRIX, GROUP ROWS HAVING HIGH CORRELATION, ... | 2017-07-11T 13:56:48 | 83.6MB |
| 22dc2a88 | CORRELATION ANALYSIS (MOVING AVERAGE PRE-PROCESS) | TO REDUCE NOISE OF CORRELATION ANALYSIS, PRE-PROCESSING OF MOVING AVERAGE ... | 2017-07-11T 15:29:03 | 52.3MB |
| ⋮ | ⋮ | ⋮ | | |

401 / 402 / 403 / 404 / 405

ANALYSIS MODEL PREPARING SYSTEM, PROGRAMMING APPARATUS, AND ANALYSIS MODEL PREPARING METHOD

BACKGROUND OF THE INVENTION

1. Field of the Invention

The present invention relates to an analysis model preparing system, a programming apparatus, and an analysis model preparing method, which are used for data analysis.

2. Description of Related Art

Data analysis using machine learning or the like is widely used so as to make use of data accumulated inside and outside a company for management efficiency or marketing. In order to analyze data, an analysis model for calculating a target value, such as a demand forecast value or the like, by using known data is required.

With respect to using the data analysis for management efficiency and marketing, it is desired to quickly prepare the analysis model to cope with recent quick business changes. However, in order to prepare the analysis model having high precision, is required to select and tune an appropriate model among innumerable data and analysis methods via trial and error by repeating prototyping and testing the analysis model. Accordingly, it takes time to prepare the analysis model. In particular, in data analysis, one test may take time from several tens of minutes to several hours, and thus quick generation of analysis model may be hindered.

Technologies for improving the efficiency of preparing the analysis model are included in http://help.pervasive-.com/display/DF660/Creating+and+executing+DataFlow+workflows and JP-T-2016-537755.

The document in http://help.pervasive.com/display/DF660/Creating+and+executing+DataFlow+workflows discloses a technology of caching intermediate data generated during processes of an analysis model executed immediately before, and then using the cache afterward to partially execute the possesses of the analysis model. According to such a technology, processes of the same analysis model are not required to be executed from the beginning at every test, and thus the efficiency of preparing an analysis model may be increased.

JP-T-2016-537755 discloses a technology in which a compilation agent accesses a cache of previously compiled types, determines which of the individually loadable types are to be re-compiled based upon the changes made by a developer, and compiles only those identified types.

The technology disclosed in JP-T-2016-537755 is a technology for improving the efficiency of trial and error of source code preparations and tests. Through this technology, issues related to time and costs during a development phase, which occur when a compiler re-compiles an entire system to activate the system, may be solved.

However, following development processes are performed during trial and error while preparing an analysis model. As a result of changing and then executing an analysis model, the analysis model is restored to processes before change because the analysis model before change had better precision, or the like. Alternatively, a plurality of analysis models are prepared, and then precisions thereof are compared and reviewed through tests.

Considering such development processes, since the technology disclosed in http://help.pervasive.com/display/DF660/Creating+and+executing+DataFlow+workflows caches only the intermediate data of the analysis model executed immediately before, caches of the intermediate data could not be applied when the analysis model is restored to processes prepared and executed in the past.

Also, the technology disclosed in JP-T-2016-537755 manages the cache of previously compiled type and the individual type in association with each other. Thus, in the technology disclosed in JP-T-2016-537755, even when types are the same, past intermediate data having different preceding processes could be erroneously applied. This is because the intermediate data generated in the analysis model depends on processes before individual processes, in addition to the individual processes in the analysis model.

SUMMARY OF THE INVENTION

The present invention provides an analysis model preparing system, a programming apparatus, and an analysis model preparing method, which are capable of improving the efficiency of execution of an analysis model before change, even when the analysis model is changed.

According to a first aspect of the present invention, there is provided an analysis model preparing system including: an execution unit configured to execute at least a part of an analysis model; a partial execution unit configured to partially execute the analysis model based on intermediate data generated during execution of the analysis model; a cache configured to temporarily maintain the intermediate data; a cache processing unit configured to perform reading and writing processes on the intermediate data in the cache; a maintaining unit configured to maintain, as mapping information, corresponding relationship between the intermediate data and the analysis model; a storage unit configured to store the analysis model and the intermediate data via a network; and a general processing unit configured to execute a process of generating the mapping information by associating the intermediate data with the analysis model and writing the mapping information on the maintaining unit, and a process of reading the intermediate data associated with the analysis model from the storage unit and writing the intermediate data on the cache via the cache processing unit, based on the mapping information.

According to the present invention, efficiency of execution of an analysis model before change can be improved even when the analysis model is changed.

BRIEF DESCRIPTION OF THE DRAWINGS

FIG. 5 is a diagram illustrating an example of a data structure of an analysis model, according to the first embodiment;

FIG. 6 is a diagram illustrating a configuration example of mapping information of FIG. 1;

FIG. 7 is a diagram illustrating a configuration example of an analysis model meta information of FIG. 1;

DESCRIPTION OF EMBODIMENTS

Exemplary embodiments will be described with reference drawings. However, the embodiments described hereinafter do not limit the invention according to claims, and all elements and combinations thereof described in the embodiments are not necessarily essential.

First Embodiment

Figure 1:
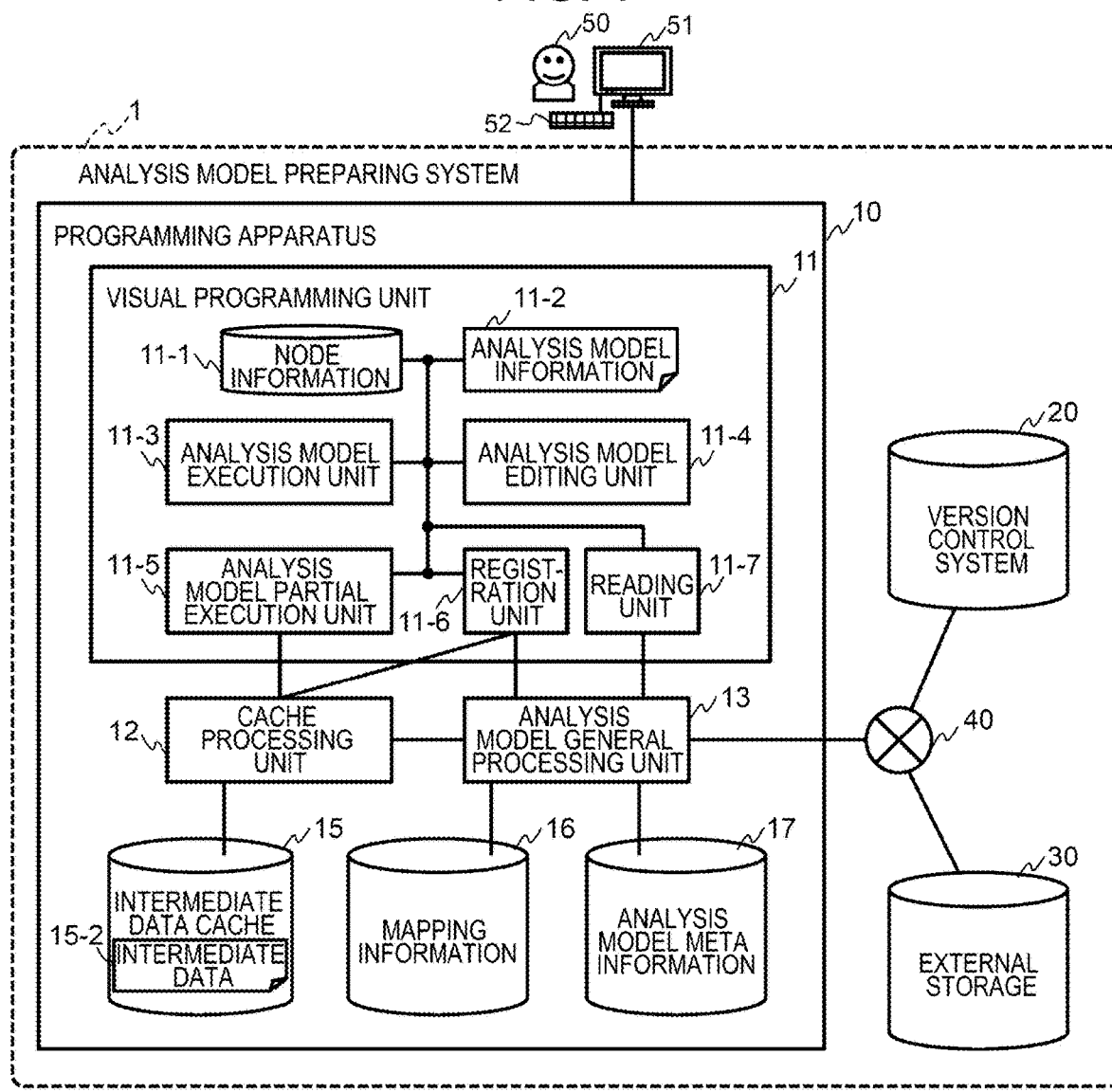
FIG. 1 is a block diagram illustrating a functional configuration of an analysis model preparing system according to a first embodiment.

FIG. 1 is a block diagram illustrating a functional configuration of an analysis model preparing system 1 according to a first embodiment.

Referring to FIG. 1, the analysis model preparing system 1 includes a programming apparatus 10, a version control system 20, and external storage 30. The programming apparatus 10 is connected to the version control system. 20 and the external storage 30 through a network 40. The programming apparatus 10 may communicate with the version control system 20 and the external storage 30 through the network 40. The programming apparatus 10 contains information of a uniform resource locator (URL) or Internet protocol (12) address which the version control system 20 and the external storage 30 access.

In addition, the version control system 20 and the external storage 30 may be provided inside the programming apparatus 10. Also, the version control system 20 and the external storage 30 may be provided in one storage apparatus. Such a storage apparatus may include a storage area used as the version control system 20 and a storage area used as the external storage 30.

The programming apparatus 10 prepares or executes an analysis model. The analysis model is a group of a series of processes for processing data. The programming apparatus 10 is capable of partial execution of the analysis model by using intermediate data 15-2. The intermediate data 15-2 is data generated during execution of the analysis model, when at least a part of the analysis model is executed. Here, the programming apparatus 10 may maintain the intermediate data 15-2 and a corresponding relationship between the intermediate data 15-2 and the analysis model. In addition, when the analysis model includes a plurality of nodes partially executing the analysis model, a corresponding relationship between the intermediate data 15-2 and the nodes may be maintained per analysis model. In this case, the intermediate data 15-2 may be used as an input value of each node.

The programming apparatus 10 further includes a visual programming unit 11, a cache processing unit 12, an analysis model general processing unit 13, and an intermediate data cache 15. Also, the programming apparatus 10 may store mapping information 16 and analysis model meta information 17.

The visual programming unit 11 visualizes the analysis model, and prepares or executes the visualized analysis model. Here, an analysis model preparer 50 may execute visual programming by using the programming apparatus 10. In order to visualize a programming operation, an output device 51, such as a liquid crystal display, may be used. The visual programming unit 11 may use a graphical user interface (GUI) to prepare or execute the visualized analysis model. The visual programming unit 11 may output a GUI screen for editing the analysis model to the output device 51. The analysis model preparer 50 may prepare or edit the analysis model by using and operating an input device 52 on the GUI screen.

Figure 2:
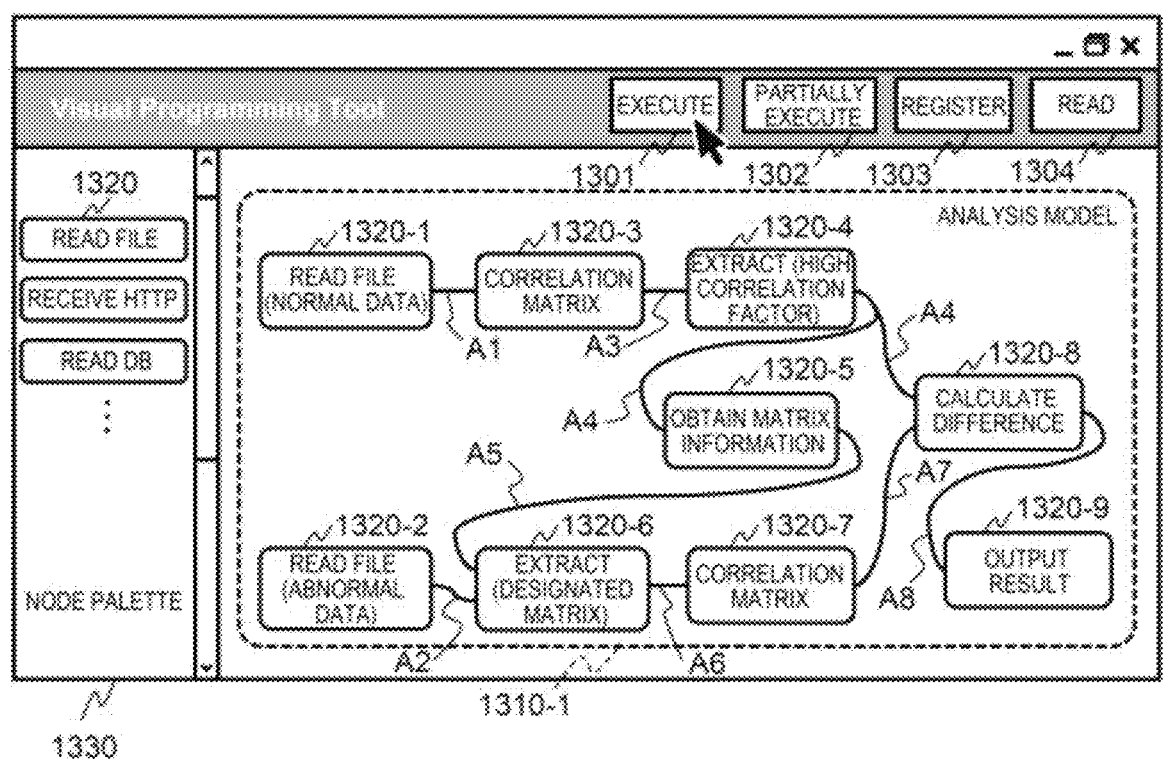
FIG. 2 is a diagram illustrating an example of a GUI screen of an analysis model, according to the first embodiment.

FIG. 2 is a diagram illustrating an example of a GUI screen of an analysis model, according to the first embodiment.

Referring to FIG. 2, the GUI screen displays an analysis model 1310-1, a node palette 1330, an execution button 1301, a partial execution button 1302, a registration button 1303, and a read button 1304. The node palette 1330 may be arranged on a right side of the screen, the analysis model 1310-1 may be arranged on a left side of the screen, and the execution button 1301, the partial execution button 1302, the registration button 1303, and the read button 1304 may be arranged on an upper side of the screen.

Nodes 1320 are displayed on the node palette 1330. The node 1320 may represent a unit when an analysis model is partially executed. Here, the node 1320 may constitute a component of processes visualized by an icon or the like. The analysis model 1310-1 may be represented by the plurality of nodes 1320 and a connection relationship between such nodes 1320.

The nodes 1320 may be largely divided into three types, which are an input node for receiving an input from the outside, a process node for converting data into data of another format, and an output node for external output. Examples of the input node include a file reading node for inputting data from a file and a hypertext transfer protocol (HTTP) receiving node for receiving an HTTP request.

Examples of the process node include an extracting node for extracting data based on a set condition, a correlation matrix calculating node for calculating a correlation matrix of data, and an external executing node for processing input data by an arbitrary program. Examples of the output node include a result output node for outputting data on a GUI screen and an HTTP output node for transmitting an HTTP response.

Here, the analysis model preparer 50 may combine the nodes 1320 to prepare the analysis model 1310-1 through GUI of a visual programming tool. In detail, the analysis model preparer 50 arranges the nodes 1320 in the node palette 1330 on the right side of the screen. Then, the analysis model preparer 50 may connect the nodes 1320 in a line to prepare the analysis model 1310. The nodes 1320 are connected such that an output of any one node 1320 becomes an input of another node 1320.

Here, a left end of the node 1320 indicates an input and a right end of the node 1320 indicates an output. For example, in the analysis model 1310-1, an output of a correlation matrix calculating node 1320-3 becomes an input of an extracting node 1320-4, and an output of the extracting node 1320-4 becomes inputs of a matrix information obtaining node 1320-5 and a difference calculating node 1320-8. Also, in the analysis model 1310-1, an execution order of processes is determined based on the connection relationships between the nodes 1320. In detail, the execution order is determined such that the extracting node 1320-4 is executed after the correlation matrix calculating node 1320-3 is executed.

When the analysis model preparer 50 presses the execution button 1301, entire processes of the analysis model 1310-1 are executed (hereinafter, referred to as entire execution).

When the analysis model preparer 50 presses the registration button 1303, the current analysis model 1310-1 is stored. Also, when the analysis model preparer 50 presses the read button 1304, the analysis model 1310-1 selected by the analysis model preparer 50 is read.

Also, when the analysis model preparer 50 presses the partial execution button 1302 after selecting at least one node 1320 connected by the line of the analysis model 1310-1, only the selected node 1320 is executed by using the intermediate data 15-2 (hereinafter, referred to as partial execution).

For example, in the analysis model 1310-1, when the analysis model preparer 50 presses the partial execution button 1302 after selecting the difference calculating node 1320-8 and a result output node 1320-9, only the difference calculating node 1320-8 and the result output node 1320-9 are executed.

The analysis model 1310-1 may detect abnormality based on a difference between correlation values during normality and abnormality. The analysis model preparer 50 may repeatedly modify the analysis model 1310-1 and execute (test) the modified analysis model 1310-1 such that the difference between the abnormality and the normality output from the result output node 1320-9 is increased.

When the analysis model 1310-1 is entirely executed as the execution button 1301 is pressed, input values A1 to A8 of the individual nodes 1320-1 to 1320-9 are maintained as the intermediate data 15-2. For example, the input values A4 and A7 are maintained as the intermediate data 15-2 with respect to the difference calculating node 1320-8. Here, the intermediate data 15-2 of the difference calculating node 1320-8 becomes a correlation matrix calculated by the high correlation extracting node 1320-4 and a correlation matrix calculated by a correlation matrix calculating node 1320-7.

Here, the analysis model preparing system 1 maintains the input values A1 to A8 of the individual nodes 1320-1 to 1320-9 as the intermediate data 15-2, such that, for example, the intermediate data 15-2 corresponding to the input values A4 and A7 of the difference calculating node 1320-8 may be obtained without having to execute processes of the nodes 1320-1 to 1320-7 even when the analysis model preparer 50 only modified the difference calculating node 1320-8.

Accordingly, only the difference calculating node 1320-8 and the result output node 1320-9 may be partially executed by inputting the input values A4 and A7 to the difference calculating node 1320-8 as the intermediate data 15-2. Thus, the analysis model preparer 50 may repeat tests of the analysis model 1310-1 without having to execute calculations of the processes of the nodes 1320-1 to 1320-7 that have not changed, each time the analysis model 1310-1 is tested.

After the test of the analysis model 1310-1 is completed, the analysis model preparer 50 may register the analysis model 1310-1 by pressing the registration button 1303.

Figure 3:
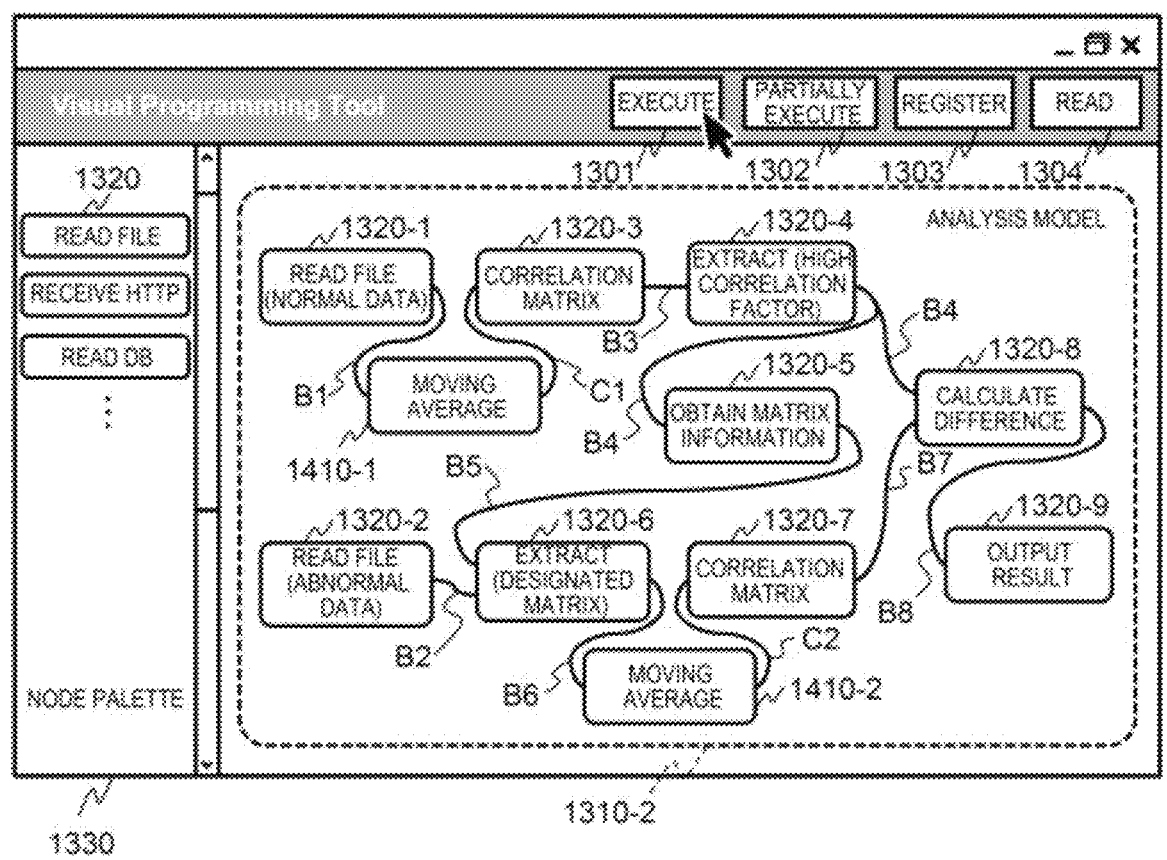
FIG. 3 is a diagram illustrating an example of a GUI screen after the analysis model of FIG. 2 is changed.

FIG. 3 is a diagram illustrating an example of a GUI screen after the analysis model of FIG. 2 is changed.

Referring to FIG. 3, it is assumed that many errors were detected in a result output of the analysis model 1310-1 due to an effect of noise (unnecessary fluctuation values), and that the analysis model preparer 50 tried to reduce the noise by performing moving average as a pre-process of correlation matrix calculation. At this time, it is assumed that the analysis model preparer 50 prepared an analysis model 1310-2 by adding moving average nodes 1410-1 and 1410-2 to the analysis model 1310-1 of FIG. 2.

After preparing the analysis model 1310-2, the analysis model preparer 50 may entirely execute the analysis model 1310-2 by pressing the execution button 1301. Here, input values of the individual nodes 1320-1 to 1320-9, 1410-1, and 1410-2 are B1 to B8, C1, and C2. In other words, since the moving average nodes 1410-1 and 1410-2 are added to the analysis model 1310-2, input values of the nodes 1320-3 to 1320-9 at downstream of the moving average nodes 1410-1 and 1410-2 are chanced.

When the analysis model 1310-2 is entirely executed, for example, the input values of the difference calculating node 1320-8 are changed from A4 and A7 to B4 and B7. This is because the input values of the difference calculating node 1320-8 are also dependent on the input value B3 of the high correlation extracting node 1320-4 and the input value C2 of the correlation matrix calculating node 1320-7, which are in the preceding stage of the difference calculating node 1320-8.

Here, the input values A1 to A8 of the individual nodes 1320-1 to 1320-9 are maintained as the intermediate data 15-2 when the analysis model 1310-1 is entirely executed, but when the analysis model 1310-2 is entirely executed, the input values C1, B2, B3, B4, B5, C2, B7, and B8 of the individual nodes 1320-1 to 1320-9 are maintained as the intermediate data 15-2.

Here, the analysis model 1310-2, in which a moving average process is added to the analysis model 1310-1, may have a worse result output than the analysis model 1310-1.

In this case, the analysis model preparer 50 may re-read the analysis model 1310-1 by pressing the read button 1304. At this time, the GUI screen of FIG. 3 may be switched to the GUI screen of FIG. 2. Then, processes on the analysis model 1310-1 may be re-prepared on the GUI screen of FIG. 2.

Then, it is assumed that the analysis model preparer 50, for example, modified the difference calculating node 1320-8 of the analysis model 1310-1 on the GUI screen of FIG. 2. Then, it is assumed that the analysis model preparer 50 pressed the partial execution button 1302 after selecting the difference calculating node 1320-8 and the result output node 1320-9.

At this time, in the prior art, the input values of the difference calculating node 1320-8 during the partial execution of the analysis model 1310-1 should be A4 and A7, but when the analysis model 1310-1 is restored after executing the analysis model 1310-2, B4 and B7 are maintained as the input values of the difference calculating node 1320-8. Accordingly, regardless of the partial execution of the analysis model 1310-1, the input values B4 and B7 calculated during execution of the analysis model 1310-2 are input to the difference calculating node 1320-8.

As a result, a correct output is unable to be obtained during the partial execution of the difference calculating node 1320-8 when the analysis model 1310-1 is restored after the analysis model 1310-2 is executed. Thus, in order to obtain a correct output from the difference calculating node 1320-8, the input values A4 and A7 need to be input to the difference calculating node 1320-8 by entirely executing the analysis model 1310-2 to re-calculate the input values A4 and A7 of the difference calculating node 1320-8.

Here, the analysis model preparing system 1 may not only maintain the input values A1 to A8 of the individual nodes 1320-1 to 1320-9 as the intermediate data 15-2, but may also maintain a correlation relationship between the intermediate data 15-2 and the analysis model 1310-1.

By also maintaining the correlation relationship between the intermediate data 15-2 and the analysis model 1310-1, the input values A1 to A8 of the individual nodes 1320-1 to 1320-9 of the analysis model 1310-1 may be read during partial execution of the analysis model 1310-1. Thus, the input values A1 to A8 that were obtained during execution of the analysis model 1310-1 are used instead of the input values B1 to B8 that were obtained during execution of the analysis model 1310-2, without having to entirely execute the analysis model 1310-1 again.

For example, when the analysis model 1310-2 is entirely executed, the input values of the difference calculating node 1320-8 are B4 and B7. At this time, the input values A4 and A7 of the difference calculating node 1320-8 associated with the analysis model 1310-1 are maintained with respect to the analysis model 1310-1.

Accordingly, even when the analysis model 1310-1 is restored after the execution of the analysis model 1310-2, the input values A4 and A7 of the difference calculating node 1320-8 associated with the analysis model 1310-1 may be used during the partial execution of the analysis model 1310-1.

As a result, a correct output may be obtained even when the analysis model 1310-1 is restored after the execution of the analysis model 1310-2, and then the partial execution of the difference calculating node 1320-8 is performed after modifying the difference calculating node 1320-8. Accordingly, the analysis model 1310-1 is not required to be entirely executed so as to obtain a correct output from the difference calculating node 1320-8, and thus the efficiency of execution of the analysis model 1310-1 may be improved.

Generally, during a trial and error process of preparing an analysis model, restoring the analysis model to a past state or rereading the analysis model of another pattern prepared in the past frequently occurs. Also, data analysis often takes several tens of minutes to several hours for one execution. Thus, when partial execution is performed without performing entire execution, execution time of analysis processes may be reduced, and thus the trial and error process of preparing an analysis model may become effective.

In addition, an apparatus for preparing or executing of an analysis model is not limited to the programming apparatus 10 of a visual programming type. For example, the programming apparatus 10 may prepare an analysis model with a character string like a text editor or the like. When an analysis model is prepared with a character string, data generated during execution of the analysis model may be intermediate data. For example, the intermediate data 15-2 may be a variable or constant value used during the execution of the analysis model.

Hereinafter, a structure and operations of the programming apparatus 10 of FIG. 1 are described in detail.

The visual programming unit 11 includes node information 11-1, analysis model information 11-2, an analysis model execution unit 11-3, an analysis model editing unit 11-4, an analysis model partial execution unit 11-5, a registration unit 11-6, and a reading unit 11-7.

The node information 11-1 maintains definition information of each node 1320. The definition information of each node 1320 contains a definition of a process during execution of each node 1320, a definition of an input data format and output data format of the node 1320, a definition of a parameter that is settable to the node 1320 by the analysis model preparer 50, and a definition of a display format (an icon or the like) of the node 1320 on GUI. In addition, input data and output data of the node 1320 are serializable data, and for example, may be data in which a character string and binary data are combined.

The analysis model information 11-2 is a file defining processes of the analysis model 1310. The analysis model information 11-2 contains information of the node 1320 of the analysis model 1310, a parameter thereof, and a connection relationship. The analysis model information 11-2 may be configured as a serializable data, and for example, may be maintained as a file of a character string written in a JavaScript Object Notation (JSON) format.

However, the analysis model information 11-2 may be binary data other than a character string, or may be data in which a character string and binary data are combined, as long as it is serializable.

When the programming apparatus 10 prepare the analysis model 1310 with a character string like a text editor, the analysis model information 11-2 is a source code itself prepared by the analysis model preparer 50.

In order to partially execute an analysis model prepared with a character string, the analysis model preparer 50 may define a variable or constant used as the intermediate data 15-2, in the analysis model information 11-2.

The analysis model information 11-2 is generated, changed, or deleted by the analysis model editing unit 11-4 based on a GUI operation of the analysis model preparer 50. However, the analysis model information 11-2 is also changed during processes of the registration unit 11-6 or the reading unit 11-7, and thus is changed by the analysis model general processing unit 13.

Each node 1320 of the analysis model 1310 has an ID (hereinafter, referred to as a node ID) that is unique in the visual programming unit 11. Thus, even when a same type of node 1320 is used several times in the analysis model 1310, each node 1320 may be uniquely identified in the analysis model information 11-2.

The analysis model execution unit 11-3 analyzes and executes the analysis model information 11-2. Execution forms of the analysis model execution unit 11-3 include a case in which entire processes of the analysis model 1310 are executed (entire execution) and a case in which only a range of nodes 1320 selected by the analysis model preparer 50 is executed (partial execution). The analysis model preparer 50 may designate which one of the entire execution and the partial execution is to be performed, on the GUI screen of FIG. 2 or FIG. 3 by using the analysis model editing unit 11-4. At this time, the nodes 1320 that are execution targets of the partial execution are transmitted from the analysis model editing unit 11-4, as a set of node IDs.

Hereinafter, processes of entire execution and partial execution of an analysis model are described in detail.

During the entire execution of the analysis model, the analysis model execution unit 11-3 searches the analysis model information 11-2 to detect the node 1320 (hereinafter, referred to as a node NA) whose input value does not depend on another node 1320, and performs processes. In addition, the number of nodes NA is not necessarily limited to one. For example, in FIG. 2, the nodes NA are a file reading node 1320-1 and a file reading node 1320-2.

While performing the processes of each node 1320, a set value of each node 1320 defined in the analysis model information 11-2 is assigned to an input value of each node 1320. Also, the analysis model execution unit 11-3 performs the processes of each node 1320 defined in the node information 11-1. For example, when the processes of the extracting node 1320-4 of FIG. 2 are performed, the input value A4 of the extracting node 1320-4 is a correlation matrix output from the correlation matrix calculating node 1320-3. Here, a set value of the extracting node 1320-4 is an extracting condition or the like set by the analysis model preparer 50.

When the processes of any one node 1320 are completed, the analysis model execution unit 11-3 executes a connected node 1320 such that an output of any node 1320 becomes an input of the connected node 1320. Accordingly, the processes are transmitted from the any node 1320 to the node 1320 connected to the any node 1320, and the processes of the analysis model 1310 are performed. For example, when the extracting node 1320-4 of FIG. 2 is executed, the matrix information obtaining node 1320-5 and the difference calculating node 1320-8 are executed next.

However, the node 1320 may be defined such that the processes are not performed until a plurality of inputs are all obtained. For example, in FIG. 2, the difference calculating node 1320-8 is defined such that the processes are not performed until the plurality of input values A4 and A7 are all obtained. Thus, even when the extracting node 1320-4 is executed, the difference calculating node 1320-8 is not executed until the correlation matrix calculating node 1320-7 is executed. Accordingly, when the extracting node 1320-4 is executed, only the matrix information obtaining node 1320-5 is executed next.

Also, while performing the processes of each node 1320, the analysis model execution unit 11-3 stores the input value of each node 1320. When there is no more executable node 1320 in the analysis model, the entire execution of the analysis model is ended.

During partial execution of the analysis model, the analysis model execution unit 11-3 extracts information of the node 1320 included in the set of node IDs transmitted from the analysis model editing unit 11-4, from the analysis model information 11-2. Then, from the extracted range, the node 1320 (hereinafter, referred to as a node NB) whose input value does not depend on another node 1320 is detected and executed.

Here, the intermediate data 15-2 may be used as the input value of the node NB. The intermediate data 15-2 may be obtained through the analysis model partial execution unit 11-5. When the analysis model is partially executed based on the intermediate data 15-2, the analysis model execution unit 11-3 may invoke the analysis model partial execution unit 11-5. Then, the analysis model partial execution unit 11-5 may partially execute the analysis model based on the intermediate data 15-2.

For example, regarding the analysis model 1310-1 of FIG. 2, it is assumed that the analysis model preparer 50 selects and partially executes the difference calculating node 1320-8 and the result output node 1320-9. At this time, the node NB is the difference calculating node 1320-8. Also, the intermediate data 15-2 at this time is an output value of the extracting node 1320-4 and an output value of the correlation matrix calculating node 1320-7 when the analysis model 1310-1 was executed last time.

The processes and transmitting of the processes of each node 1320 with respect to the partial execution are performed in the same manner as the entire execution. However, when the node 1320 to be executed is outside a specified range of the partial execution processes after the node 1320 are stopped. Also, during the partial execution of processes of the node 1320, the analysis model execution unit 11-3 stores the input value of each node 1320. When there is no more executable node 1320, the partial execution is ended.

Regardless of entire execution and partial execution, after the processes of the analysis model information 11-2 are ended, the analysis model execution unit 11-3 may cache the input value of each node 1320 as the intermediate data 15-2 through the analysis model partial execution unit 11-5. Accordingly, when processes of a next analysis model are partial execution, the intermediate data 15-2 may be used as the input value of each node 1320.

However, when the programming apparatus 10 prepares the analysis model 1310 with a character string like a text editor, the analysis model execution unit 11-3 analyzes and executes the source code of the analysis model information 11-2. Here, regardless of entire execution and partial execution, the variable or constant specified by the analysis model preparer 50 in the actual analysis model information 11-2 are saved as the intermediate data 15-2, and are stored in the intermediate data cache 15 through the analysis model partial execution unit 11-5 after the execution is ended.

Also, when the partial execution is started, the intermediate data 15-2 obtained through the analysis model partial execution unit 11-5 is assigned as the variable or constant specified by the analysis model preparer 50, and then the source code in a range specified by the analysis model preparer 50 is executed.

The analysis model editing unit 11-4 provides a GUI for preparing the analysis model 1310 to the analysis model preparer 50. Then, the analysis model information 11-2 is generated, chanced, and deleted based on a GUI operation of the analysis model preparer 50. The GUI screen of the analysis model editing unit 11-4 may be displayed, for example, on a liquid crystal display or the like. In addition, the GUI of the analysis model editing unit 11-4 may be provided as a web application.

As the GUI of the analysis model editing unit 11-4, for example, the visual programming tool displaying the GUI screen of FIG. 2 may be used. However, in the GUI of the analysis model editing unit 11-4, a registration form display button 801 of FIGS. 11 and 12 may be displayed instead of the registration button 1303 of FIG. 2, and a reading form display button 802 of FIGS. 11 and 12 may be displayed instead of the read button 1304 of FIG. 2.

The GUI of the analysis model editing unit 11-4 may arrange or connect the nodes 1320, or set a parameter. The GUI of the analysis model editing unit 11-4 may display a plurality of buttons. Then, when the analysis model preparer 50 presses a corresponding button, each process may be started.

In detail, when the execution button 1301 is pressed, the analysis model editing unit 11-4 invokes the analysis model execution unit 11-3. When the registration form display button 801 is pressed, the analysis model editing unit 11-4 invokes the registration unit 11-6. When the reading form display button 802 is pressed, the analysis model editing unit 11-4 invokes the reading unit 11-7. When the partial execution button 1302 is pressed after an execution range of the analysis model information 11-2 is selected, the analysis model editing unit 11-4 invokes the analysis model execution unit 11-3 while transmitting information of a set of node IDs included in the selected range.

However, when the programming apparatus 10 prepares the analysis model 1310 with a character string like a text editor, the GUI of the analysis model editing unit 11-4 may display a character input by the analysis model preparer 50.

The analysis model partial execution unit 11-5 partially executes the analysis model 1310 based on the intermediate data 15-2 generated during the execution of the analysis model 1310. At this time, the analysis model partial execution unit 11-5 may store and read the intermediate data 15-2 used as the analysis model information 11-2. In addition, in FIG. 1, the analysis model execution unit 11-3 and the analysis model partial execution unit 11-5 are shown as separate blocks, but the analysis model partial execution unit 11-5 may be operated as a part of functions of the analysis model execution unit 11-3.

While storing the intermediate data 15-2, the analysis model execution unit 11-3 transmits the node ID of each node 1320 included in the analysis model 1310 and the input value during execution. Then, the analysis model partial execution unit 11-5 serializes data based on information of an input data format of the node 1320 of the node information 11-1, and transmits, as a pair, the node ID and the serialized input value to the cache processing unit 12.

For example, when the node ID of the extracting node 1320-4 is "9dbc4b3b" while storing the intermediate data 15-2 of the execution node 1320-4 of FIG. 2, the analysis model partial execution unit 11-5 serializes the input value of the extracting node 1320-4 (which is a correlation matrix output by the correlation matrix calculating node 1320-3), based on the input data format of the extracting node 1320-4 in the node information 11-1 (hereinafter, referred to as data DA). Then, "9dbc4b3b" and the data DA are paired and transmitted to the cache processing unit 12.

While reading the intermediate data 15-2, a set of node IDs to be read is received from the analysis model execution unit 11-3. Then, the analysis model partial execution unit 11-5 obtains the intermediate data 15-2 corresponding to the node ID through the cache processing unit 12, and de-serializes the data based on the information of the input data format of the node 1320 of the node information 11-1, and transmits a set of pairs of the node IDs and de-serialized intermediate data 15-2 to the analysis model execution unit 11-3.

For example, while reading the intermediate data 15-2 of the extracting node 1320-4 of FIG. 2, "9dbc4b3b" that is the node ID of the extracting node 1320-4 is transmitted to the cache processing unit 12 to obtain the data DA. Then, the node ID "9dbc4b3b" and the data DA are transmitted, as a pair, to the analysis model execution unit 11-3.

Here, when serialization is not required while storing the input value of each node 1320 as the intermediate data 15-2, the analysis model partial execution unit 11-5 does not perform serialization and de-serialization. Also, during the serialization and de-serialization, the intermediate data 15-2 may be compressed by using a data compression format, such as ZIP, TAR, or the like.

When the analysis model partial execution unit 11-5 fails to obtain the intermediate data 15-2, the analysis model execution unit 11-3 is notified that the obtaining is failed.

While registering the analysis model 1310, the registration unit 11-6 receives an input and outputs a result by using the GUI. At this time, the registration unit 11-6 generates a registration form 810 for registering the analysis model 1310, notifies an error, and requests the analysis model general processing unit 13 to register the analysis model information 11-2. A specific example of the registration form 810 will be described later.

While reading or deleting the analysis model 1310, the reading unit 11-7 receives an input and outputs a result by using the GUI. At this time, the reading unit 11-7 generates a reading form 901, notifies an error, and transmits an analysis model read request and an analysis model deletion request to the analysis model general processing unit 13. A specific example of the reading form 901 will be described later. Here, the reading unit 11-7 may store a revision ID 401 of the analysis model information 11-2 that failed in a deletion request, and not display the reading form 901 afterward.

The cache processing unit 12 stores, reads, deletes, and presents the intermediate data 15-2 with respect to the intermediate data cache 15.

As a storing process, when the node ID and the intermediate data 15-2 are input, the cache processing unit 12 stores them in the intermediate data cache 15 in association with each other. Associating means that, for example, the intermediate data 15-2 is stored in a file whose file name is the node ID of a generation source. In detail, for example, when the intermediate data 15-2 of the extracting node 1320-4 of FIG. 2 is stored, the intermediate data 15-2 of the extracting node 1320-4 may be stored with a file name of the node ID "9dbc4b3b" of the extracting node 1320-4.

As a reading process, when the node ID is input, the cache processing unit 12 obtains the intermediate data 15-2 corresponding to the node ID from the intermediate data cache 15, and transmits the intermediate data 15-2 to a request source. Also, when all the intermediate data 15-2 is requested to be read, all the intermediate data 15-2 stored in the intermediate data cache 15 is obtained and transmitted to the request source.

As a deleting process, upon receiving a deletion request of all the intermediate data 15-2, the cache processing unit 12 deletes all the intermediate data 15-2 in the intermediate data cache 15.

As an information presenting process, when the node ID is input, the cache processing unit 12 transmits information of the intermediate data 15-2 including a name and data size specified by the node ID to a request source. Here, the data size of the intermediate data 15-2 is, for example, a file size of a file storing the intermediate data 15-2.

The analysis model general processing unit 13 may generate the mapping information 16 by associating the intermediate data 15-2 with the analysis model 1310, and maintain the mapping information 16. Also, the analysis model general processing unit 13 may obtain the intermediate data 15-2 associated with the analysis model 1310 based on the mapping information 16, and maintain the intermediate data 15-2 in the intermediate data cache 15 through the cache processing unit 12.

Here, the analysis model general processing unit 13 may transmit and receive the mapping information 16 and the analysis model meta information 17 while operating the cache processing unit 12, the registration unit 11-6, the reading unit 11-7, the version control system 20, and the external storage 30 in cooperation with each other.

Figure 11:
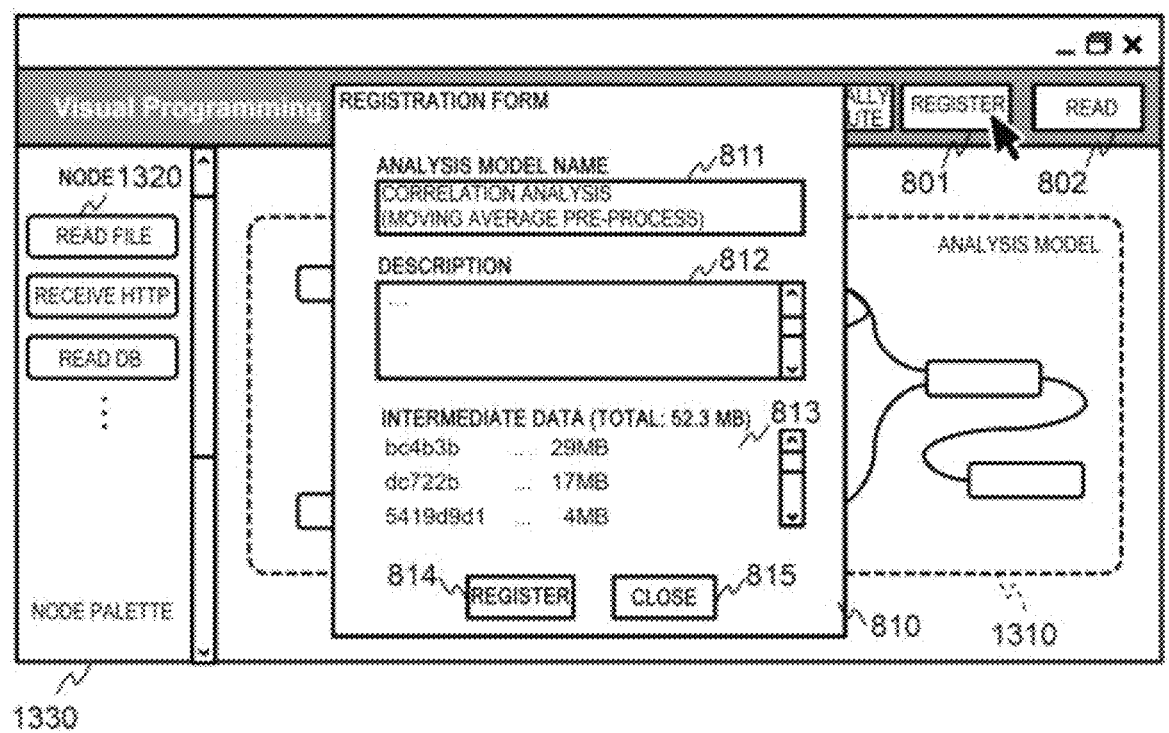
FIG. 11 is a diagram illustrating an example of an analysis model registering screen according to the first embodiment.

Here, during registration of an analysis model, the GUI of the analysis model editing unit 11-4 may display the registration form display button 801 of FIG. 11 instead of the registration button 1303 of FIG. 2 so as to be operable on the GUI screen of FIG. 11. Also, during reading of an analysis model, the GUI of the analysis model editing unit 11-4 may display the reading form display button 802 of FIG. 12 instead of the read button 1304 of FIG. 2 so as to be operable on the GUI screen of FIG. 12.

Also, the analysis model general processing unit 13 registers the analysis model information 11-2 in the version control system 20. Also, the analysis model general processing unit 13 manages the intermediate data 15-2 corresponding to the analysis model information 11-2 registered in the version control system 20, or manages meta information, such as a name of the analysis model information 11-2 or the like. Further, while reading the analysis model information 11-2 from the version control system 20, the intermediate data 15-2 corresponding to the analysis model information 11-2 is restored in the intermediate data cache 15.

By providing the analysis model general processing unit 13, the programming apparatus 10 may use the intermediate data 15-2 corresponding to the analysis model information 11-2 as a cache, even when the analysis model information 11-2 is re-read from the version control system 20. Also, when the analysis model information 11-2 is read or deleted, an outline of the analysis model information 11-2 may be provided to the analysis model preparer 50.

The intermediate data cache 15 is an area where the intermediate data 15-2 is stored. The intermediate data cache 15 may be, for example, embodied as a directory in a file system. The intermediate data cache 15 is managed by the cache processing unit 12.

However, the intermediate data cache 15 is not limited to a form of the file system as long as certain data is stored with a name and is capable of being read or deleted. For example, the intermediate data cache 15 may be embodied as object storage, a file server, a key value store, or a database.

The intermediate data 15-2 with respect to visual programming may be calculated when the visual programming unit 11 executes the analysis model information 11-2. The intermediate data 15-2 is, for example, an input value transmitted to each node 1320 configuring the analysis model 1310 when the analysis model 1310 is executed. One piece of intermediate data 15-2 is generated per node 1320 configuring the analysis model information 11-2. Accordingly, when there is a plurality of inputs as in the difference calculating node 1320-8 of FIG. 2, the intermediate data 15-2 may be maintained as one file.

When the programming apparatus 10 prepares the analysis model 1310 with a character string like a text editor, the intermediate data 15-2 is a value of an arbitrary variable or constant defined by the analysis model preparer 50 in the analysis model information 11-2. In addition, since the intermediate data 15-2 is stored in the intermediate data cache 15, the intermediate data 15-2 may be serialized or compressed.

The mapping information 16 is information for associating the intermediate data 15-2 stored in the external storage 30 with the analysis model information 11-2 registered in the version control system 20. The mapping information 16 is managed by the analysis model general processing unit 13.

The analysis model meta information 17 is information for enabling the analysis model preparer 50 to easily handle the analysis model information 11-2 when the analysis model information 11-2 is stored in the version control system 20. The analysis model meta information 17 is managed by the analysis model general processing unit 13.

The version control system 20 records or traces a change history of a source code or the like. The version control system 20 may be, for example, Git. The version control system 20 may be used to register the analysis model information 11-2, restore the analysis model information 11-2 to a past version, or switch a plurality of pieces of the analysis model information 11-2.

However, the version control system 20 is not limited to Git as long as the analysis model information 11-2 is stored in association with a unique ID. Thus, the version control system 20 may be Apache Subversion (registered trademark). Alternatively, for example, a file server or storage object may be used instead of the version control system 20.

The external storage 30 stores any requested data. As the external storage 30, for example, object storage may be used. The external storage 30 may be used to store the intermediate data 15-2.

However, the external storage 30 is not limited to a form of the object storage as long as certain data is stored with a name and is capable of being read or deleted. For example, the external storage 30 may be embodied as a file server, a key value store, or a database.

Through the above processes, when the past analysis model 1310-1 is re-read during a process of preparing the analysis model 1310-1 via trial and error, the corresponding intermediate data 15-2 may be restored in the intermediate data cache 15 simultaneously with the analysis model 1310-1. Accordingly, the analysis model preparer 50 may partially execute the analysis model 1310-1 without having to entirely execute the analysis model 1310-1 once after re-reading the analysis model 1310-1. Thus, an analysis processing time may be reduced, and efficiency of trial and error of preparing the analysis model 1310-1 may be increased.

Figure 4:
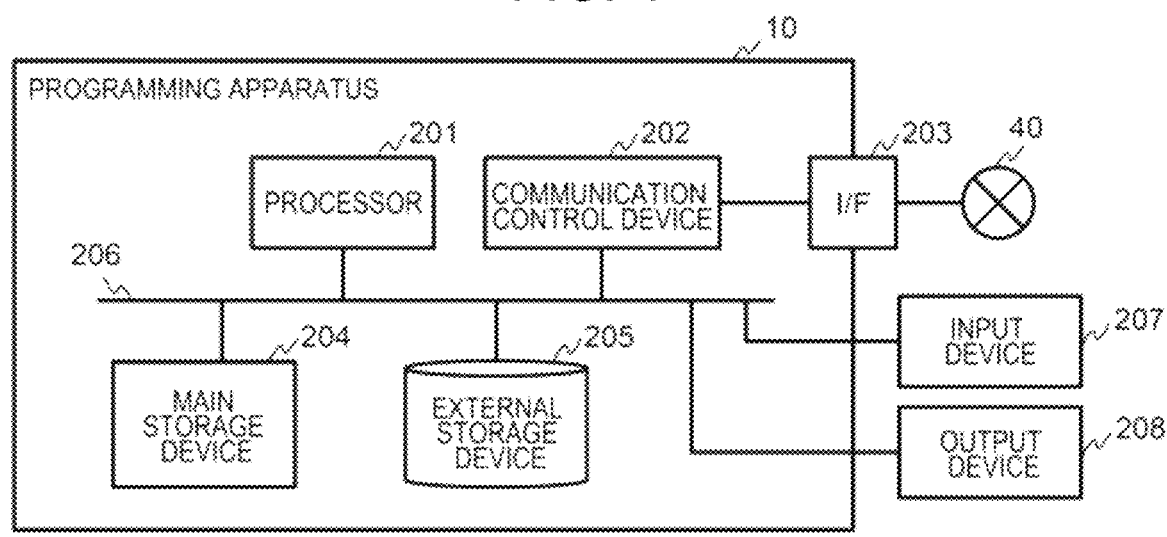
FIG. 4 is a block diagram illustrating a hardware configuration of a programming apparatus of FIG. 1.

FIG. 4 is a block diagram illustrating a hardware configuration of the programming apparatus of FIG. 1.

Referring to FIG. 4, the programming apparatus 10 includes a processor 201, a communication control device 202, a communication interface 203, a main storage device 204, and an external storage device 205. The processor 201, the communication control device 202, the communication interface 203, the main storage device 204, and the external storage device 205 may be connected to each other through an internal bus 206.

Also, an input device 207 and an output device 208 are provided as a human interface of the programming apparatus 10. The input device 207 and the output device 208 are connected to the internal bus 206.

The processor 201 is hardware controlling overall operations of the programming apparatus 10. The main storage device 204 includes, for example, a semiconductor memory, and temporarily maintains various programs or control data. The main storage device 204 may maintain programs for realizing the visual programming unit 11, the cache processing unit 12, and the analysis model general processing unit 13.

The external storage device 205 is a storage device having large storage capacity, and is, for example, a hard disk device or a solid state drive (SSD). The external storage device 205 may maintain, in addition to execution files of various programs, the analysis model information 11-2, the intermediate data 15-2, the mapping information 16, and the analysis model meta information 17. However, the intermediate data 15-2, the mapping information 16, and the analysis model meta information 17 may be stored in the main storage device 204 for improvement of a response speed or the like. The main storage device 204 and the external storage device 205 may be accessed from the processor 201.

The communication control device 202 is hardware having a function of controlling communication with the version control system 20 or the external storage 30. The communication control device 202 is connected to the network 40 through the communication interface 203. The input device 207 may include a keyboard, a mouse, or the like for the analysis model preparer 50 to perform various operation inputs. The output device 208 may include a liquid crystal display or the like for displaying various types of information.

FIG. 5 is a diagram illustrating an example of a data structure of an analysis model, according to the first embodiment.

Referring to FIG. 5, the analysis model information 11-2 may be described in JSON. In the analysis model information 11-2, setting information of the node 1320 configuring the analysis model 1310 is maintained in a list. In FIG. 5, setting information of the file reading node 1320-1 and the correlation matrix calculation node 1320-3 is illustrated as an example of setting information.

The setting information of the node 1320 includes a node ID (id), a type (type) of the node 1320 in the node information 11-1, a name (name) of the node 1320 defined by the analysis model preparer 50, coordinates (x, y) of the node 1320 on the GUI screen of the analysis model editing unit 11-4, a connected source node 1320 (wire), and settings (file name, format, and the like) unique to the node 1320.

Here, the connected node 1320 defines a connection location by describing node IDs of a group of target nodes 1320 in a list. For example, in FIG. 5, the file reading node 1320-1 indicated by the node ID "9dbc4b3b" is connected to the correlation matrix calculating node 1320-3 having a node ID "c8dc722b".

FIG. 6 is a diagram illustrating a configuration example of the mapping information 16 of FIG. 1.

In FIG. 6, the mapping information indicates a corresponding relationship between the analysis model information 11-2 registered in the version control system 20 and the intermediate data 15-2 stored in the external storage 30. The mapping information 16 may include a field of revision ID 301, a field of node ID 302, and a field of intermediate data storage location 303. The field of the revision ID 301, the field of the node ID 302, and the field of the intermediate data storage location 303 are columns. The revision ID 301 may indicate data within one record.

The revision ID 301 is an identifier assigned when a change of the analysis model information 11-2 is recorded or when the analysis model information 11-2 is registered in the version control system 20. The revision ID 301 may use, for example, a Git commit ID. The revision ID 301 is used to identify the analysis model information 11-2 registered in the version control system 20. For example, when a revision ID of e07b69fe is assigned by registering the analysis model 1310-1 of FIG. 2 in the version control system 20, the revision ID 301 of a record related to the analysis model 1310-1 is e07b69fe.

The node ID 302 is a node ID of the node 1320 that is a generation source of the intermediate data 15-2 stored in the external storage 30. The node ID 302 is used to assign the intermediate data 15-2 stored in the external storage 30 to the corresponding node 1320 in the analysis model information 11-2, when the analysis model information 11-2 is read.

The intermediate data storage location 303 indicates a storage location of the intermediate data 15-2 stored in the external storage 30. The intermediate data storage location 303 is used to obtain or delete the intermediate data 15-2. The intermediate data storage location 303 may be, for example, a URL for accessing the intermediate data 15-2 when the external storage 30 is object storage, or a file path when the external storage 30 is a file server.

Here, the URL or file path indicated by the intermediate data storage location 303 is unique in the analysis model preparing system 1. For example, when the intermediate data 15-2 is stored in the external storage 30, a storage name may be set as "<Revision ID of Analysis Model Information 11-2>.<Node ID of Generation Source>". However, as a storage name of the intermediate data 15-2, a naming method, such as Universally Unique Identifier (QUID), may be used.

For example, when the analysis model 1310-1 of FIG. 2 is registered in the version control system 20 and "e07b69fe" is obtained as a revision ID, the intermediate data 15-2 of the file reading node 1320-1 indicated by the node ID "9dbc4b3b" is registered in the external storage 30 that is object storage. In this case, a storage name of the intermediate data 15-2 when stored in the external storage 30 is "e07b69fe.9dbc4b3b".

When there are a plurality of nodes 1320 having the intermediate data 15-2 among the nodes 1320 configuring the analysis model information 11-2, records of a plurality of the node IDs 302 and the intermediate data storage locations 303 are registered with respect to one revision ID 301. For example, with respect to the analysis model 1310-1 of FIG. 2, when all nodes from the node 1320-1 to the node 1320-9 have the intermediate data 15-2, nine records are prepared with respect to the revision ID 301 of e07b69fe.

On the other hand, when the node 1320 configuring the analysis model information 11-2 does not have the intermediate data 15-2, only one record storing a character string indicating that there is no intermediate data 15-2, for example, "None", is registered in the node ID 302 and the intermediate data storage location 303 corresponding to the node 1320.

FIG. 7 is a diagram illustrating a configuration example of the analysis model meta information of FIG. 1.

In FIG. 7, the analysis model meta information 17 is information enabling the analysis model preparer 50 to easily handle the analysis model information 11-2 registered in the version control system 20. The analysis model meta information 17 includes a field of revision ID 401, a field of analysis model name 402, a field of description 403, a field of registered time 404, and a field of data amount 405.

However, the analysis model meta information 17 may not necessarily include all fields 401 to 405, but may include at least one of the fields 401 to 405.

The revision ID 401 may be the same as the revision ID 301 of FIG. 4.

The analysis model name 402 is a name of an analysis model 1310. The description 403 is information describing processes of the analysis model 1310. The analysis model name 402 and the description 403 are input by the analysis model preparer 50 when the analysis model information 11-2 is registered in the version control system 20. By registering the analysis model name 402 and the description 403 in the analysis model meta information 17, the analysis model preparer 50 understands a purpose or processes of the analysis model 1310 registered in the version control system 20, and refer to the purpose or processes when reading the analysis model 1310.

The registered time 404 is information on time when the analysis model information 11-2 is registered in the version control system 20. The registered time 404 may be expressed, for example, in a form of ISO8601. By registering the registered time 404 in the analysis model meta information 17, the analysis model preparer 50 may determine timing when the analysis model 1310 is prepared.

The data amount 405 is a total value of data sizes of the intermediate data 15-2 used in the analysis model 1310. By registering the data amount 405 in the analysis model meta information 17, the analysis model preparer 50 may determine capacity of the external storage 30 consumed by the analysis model 1310 or capacity consumed by the intermediate data cache 15 while reading the analysis model 1310.

Figure 8:
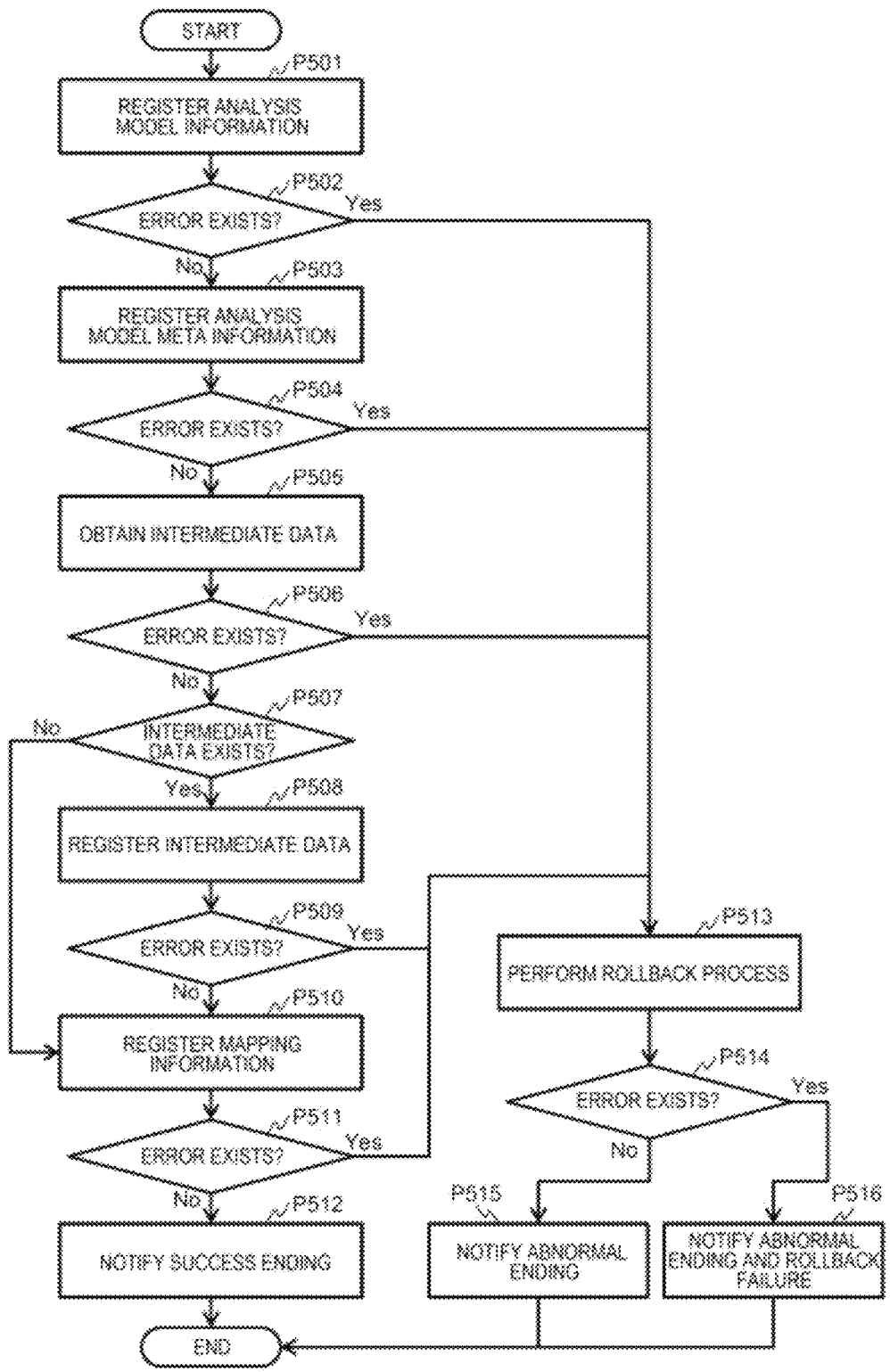
FIG. 8 is a flowchart illustrating an analysis model registration process according to the first embodiment.

FIG. 8 is a flowchart illustrating an analysis model registration process according to the first embodiment.

Referring to FIG. 8, in the analysis model registration process, the analysis model general processing unit 13 registers the analysis model information 11-2 read by the visual programming unit 11 in the version control system 20, and registers the intermediate data 15-2 used by the analysis model information 11-2 in the external storage 30.

The analysis model registration process is started when the registration unit 11-6 transmits an analysis model registration request to the analysis model general processing unit 13. The analysis model registration request includes the analysis model information 11-2, a total data size of all pieces of the intermediate data 15-2 used in the analysis model 1310, an analysis model name 811 and description 812 input by the analysis model preparer 50 using the registration form 810. The total data size of the intermediate data 15-2 used in the analysis model information 11-2 is calculated when the registration form 810 is generated.

When the analysis model registration process is started, the analysis model general processing unit 13 registers the analysis model information 11-2 in the version control system 20 in operation P501 to store a then revision ID and a registered time. For example, when the version control system 20 is Git, a change of a file of the analysis model information 11-2 is recorded by using an add command and a commit command of Git, and the change of the analysis model information 11-2 is transmitted to the version control system 20 by using a push command.

Then, in operation P502, the analysis model general processing unit 13 determines whether there is an error with respect to operation P501. When there is an error, operation P513 is performed, and when there is no error, a success of operation P501 is stored and operation P503 is performed. Examples of the error include failure to access the version control system 20, an error response from the version control system 20, and the like.

Then, in operation P503, the analysis model general processing unit 13 registers the revision ID and the registered time of the analysis model information 11-2 obtained in operation P501, the analysis model name, the description, and the total data size of the intermediate data 15-2 included in the analysis model registration request, in the analysis model meta information 17 as one record.

Then, in operation P504, the analysis model general processing unit 13 determines whether there is an error with respect to operation P503. When there is an error, operation P513 is performed, and when there is no error, a success of operation P503 is stored and operation P505 is performed. Examples of the error include failure to access the analysis model meta information 17, storage failure due to capacity limitation of the analysis model meta information 17, and the like.

Then, in operation P505, the analysis model general processing unit 13 obtains all pieces of the intermediate data 15-2 corresponding to the node 1320 included in the analysis model information 11-2 by using the cache processing unit 12.

Then, in operation P506, the analysis model general processing unit 13 determines whether there is an error with respect to operation P505. When there is an error, operation P513 is performed, and when there is no error, a success of operation P505 is stored and operation P507 is performed. Examples of the error include failure to access the cache processing unit 12, an obtaining error of the intermediate data 15-2 of the cache processing unit 12, and the like. However, it is not an error when the cache processing unit 12 normally operated and the number of obtained pieces of intermediate data 15-2 is 0.

Then, in operation P507, the analysis model general processing unit 13 determines whether one or more pieces of intermediate data 15-2 are obtained in operation P505. Then, when there are one or more pieces of intermediate data 15-2, operation P508 is performed, and when there is no intermediate data 15-2, operation P510 is performed.

Then, in operation P508, the analysis model general processing unit 13 stores the intermediate data 15-2 obtained in operation P505 in the external storage 30, and stores information of a stored location in association with a node ID of the node 1320 that is a generation source of the intermediate data 15-2. The information of a stored location is, for example, a URL of the stored location when the external storage 30 is object storage, and a file path when the external storage 30 is a file server.

Then, in operation P509, the analysis model general processing unit 13 determines whether there is an error with respect to operation P508. When there is an error, operation P513 is performed, and when there is no error, a success of operation P508 is stored and operation P510 is performed. Examples of the error include failure to access the external storage 30, failure to store the intermediate data 15-2 in the external storage 30, and the like.

Then, in operation P510, the analysis model general processing unit 13 registers, in the mapping information 16, the revision ID when the analysis model information 11-2 is registered in the version control system 20, the node ID of the node 1320 corresponding to the intermediate data 15-2, and the information of the storage location when the intermediate data 15-2 is stored in the external storage 30, as one record. When an analysis model has no intermediate data 15-2, a character string indicating that there is no intermediate data 15-2, for example, "None", is registered in the field of node ID 302 and the field of intermediate data storage location 303.

Then, in operation P511, the analysis model general processing unit 13 determines whether there is an error with respect to operation P510. When there is an error, operation P513 is performed, and when there is no error, operation P512 is performed. Examples of the error include failure to access the mapping information 16, storage failure due to capacity limitation of the mapping information 16, and the like.

Then, in operation P512, the analysis model general processing unit 13 notifies the registration unit 11-6 that the registration request of the analysis model 1310 is completed. In this manner, normal processing of analysis model registration is completed.

Hereinafter, processes when an error is detected with respect to the analysis model registration are described.

In operation P513, the analysis model general processing unit 13 cancels processes performed before an error occurred (a rollback process), so as to restore a state of the analysis model preparing system to before the analysis model registration process is started. The processes performed before an error occurred may be determined based on a flag of a success of a process stored in operations P502, P504, P509, and P511.

Hereinafter, a method of canceling each process is described.

When the registration process (operation P501) of the analysis model information 11-2 is canceled, registration information of the analysis model information 11-2 is deleted from the version control system 20. For example, when the version control system 20 is Git, a revert command is transmitted to Git together with the revision ID when the analysis model information 11-2 is registered.

When the registration process (operation P503) of the analysis model meta information 17 is canceled, the record of the revision ID of the analysis model information 11-2 is transmitted to a maintaining unit of the analysis model meta information 17.

When the registration process (operation P508) of the intermediate data 15-2 is canceled, the intermediate data 15-2 stored in operation P508 is deleted from the external storage 30.

When the registration process (operation P509) of the mapping information 16 is canceled, the record of the revision ID of the analysis model information 11-2 is transmitted to the maintaining unit of the mapping information 16.

Then, in operation P514, the analysis model general processing unit 13 determines whether there is an error with respect to operation P513. When there is an error, operation P516 is performed, and when there is no error, operation P515 is performed. Examples of the error include failure to delete registration information of the analysis model information 11-2 from the version control system 20, failure to delete the intermediate data 15-2 in the external storage 30, and the like with respect to canceling processes.

When it is determined that there is no error in operation P514, in operation P515, the analysis model general processing unit 13 notifies the registration unit 11-6 that the analysis model registration request is abnormally ended. Data transmitted at this notification time is flag information indicating that the entire process has abnormally ended, a process result (an abnormal or normal flag) of each process stored in operations P502, P504, P509, and P511, and information of the rollback process performed in operation P513.

When it is determined that there is an error in operation P514, in operation P516, the analysis model general processing unit 13 notifies the registration unit 11-6 that the analysis model registration request is abnormally ended and the rollback process (operation P513) is failed. Data transmitted at this notification time is flag information indicating that the entire process has abnormally ended, flag information indicating that the rollback process has failed, a process result (an abnormal or normal flag) of each process stored in operations P502, P504, P509, and P511, information of the rollback process performed in operation P513, and the failure of the rollback process.

As such, the analysis model preparing system 1 may normally register the analysis model information 11-2 read from the visual programming unit 11 in the version control system 20, and at the same time, normally register the intermediate data 15-2 corresponding to the analysis model 1310 in the external storage 30.

Figure 9:
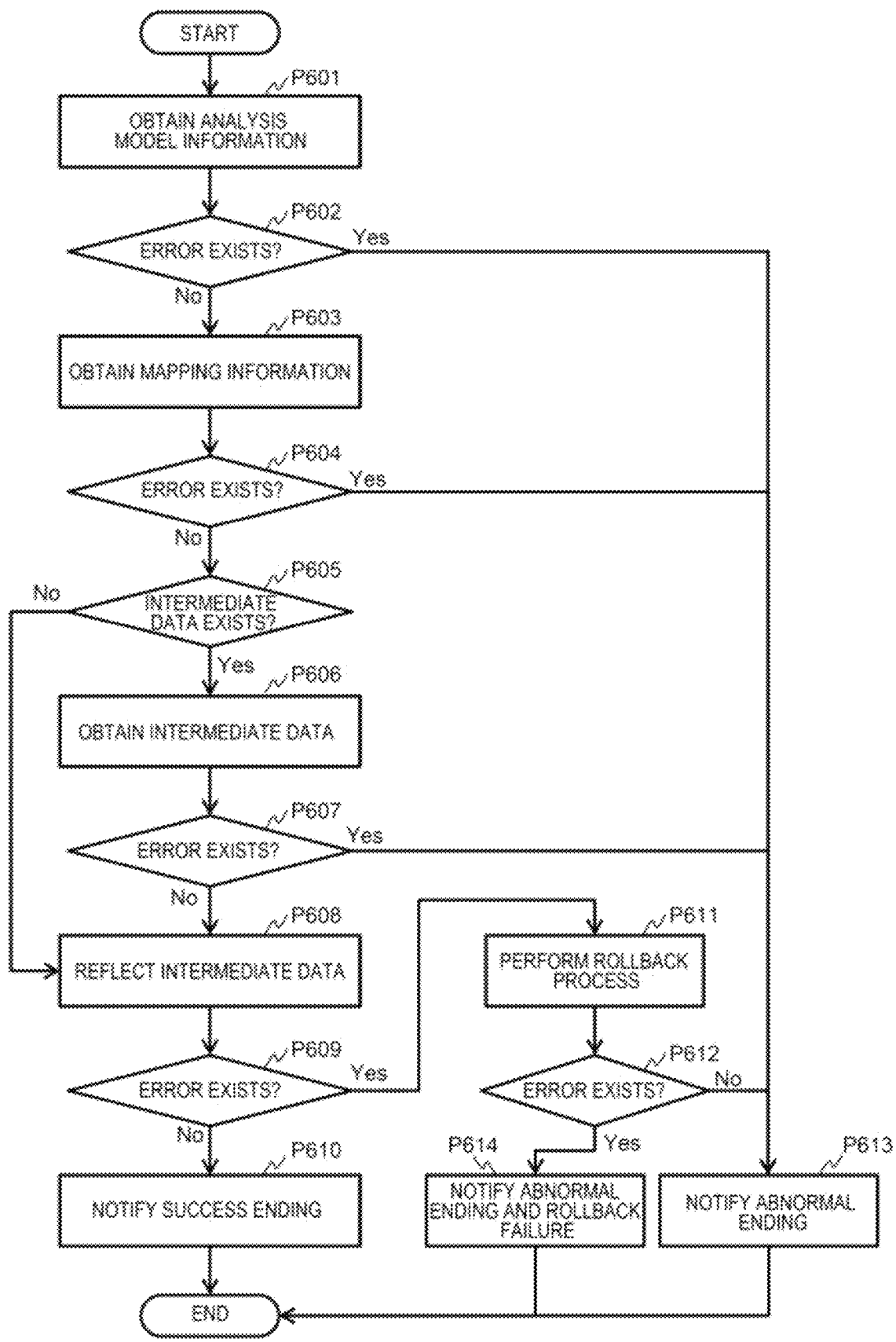
FIG. 9 is a flowchart illustrating an analysis model reading process according to the first embodiment.

FIG. 9 is a flowchart illustrating an analysis model reading process according to the first embodiment.

Referring to FIG. 9, in the analysis model reading process, the visual programming unit 11 reads the analysis model information 11-2 registered in the version control system 20, and the intermediate data 15-2 used in the analysis model 1310 is restored in the intermediate data cache 15 from the external storage 30.

The analysis model reading process is started when the reading unit 11-7 transmits an analysis model read request to the analysis model general processing unit 13. The analysis model read request includes a revision ID of the analysis model information 11-2 to be read.

When the analysis model read process is started, in operation P601, the analysis model general processing unit 13 obtains the analysis model information 11-2 corresponding to the revision ID, from the version control system 20. For example, when the version control system 20 is Git, the analysis model information 11-2 may be restored to a state indicated by the revision ID by using a checkout command of Git.

Then, in operation P602, the analysis model general processing unit 13 determines whether there is an error with respect to operation P601. When there is an error, operation P613 is performed, and when there is no error, a success of operation P601 is stored and operation P603 is performed. Examples of the error include failure to change a revision of the analysis model information 11-2, and the like.

Then, in operation P603, the analysis model general processing unit 13 obtains all records corresponding to the revision ID from the mapping information 16. One record indicates one piece of intermediate data 15-2. Each record includes the node ID 302 and the intermediate data storage location 303.

Then, in operation P604, the analysis model general processing unit 13 determines whether there is an error with respect to operation P603. When there is an error, operation P613 is performed, and when there is no error, a success of operation P603 is stored and operation P605 is performed. Examples of the error include failure to access the mapping information 16, failure to obtain data from the mapping information 16, and the like.

Then, in operation P605, the analysis model general processing unit 13 determines whether the intermediate data 15-2 used by the analysis model 1310 exists in operation P603. When the intermediate data 15-2 exists, operation P606 is performed, and when the intermediate data 15-2 does not exist, operation P608 is performed. In a method of determining existence of the intermediate data 15-2, it is determined that the intermediate data 15-2 does not exist when the record obtained in operation P603 is one row and values of the node ID 302 and the intermediate data storage location 303 are "None", and it is determined that the intermediate data 15-2 exists in other cases.

Then, in operation P606, the analysis model general processing unit 13 obtains the intermediate data 15-2 from the external storage 30 by accessing the intermediate data storage location 303 included in the record obtained in operation 2603. Then, the intermediate data 15-2 obtained from the external storage 30 is stored in association with the corresponding node ID 302.

Then, in operation P607, the analysis model general processing unit 13 determines whether there is an error with respect to operation P606. When there is an error, operation P613 is performed, and when there is no error, a success of operation P606 is stored and operation P608 is performed. Examples of the error include failure to access the external storage 30, failure to obtain the intermediate data 15-2 from the external storage 30, and the like.

Then, in operation P608, the analysis model general processing unit 13 stores the intermediate data 15-2 obtained in operation P606 in the intermediate data cache 15 by using the cache processing unit 12. When the cache processing unit 12 is used, the node ID 302 associated in operation P606 is used as a node ID of the node 1320 corresponding to the intermediate data 15-2. When the existing intermediate data 15-2 is stored in the intermediate data cache 15, all existing pieces of intermediate data 15-2 are obtained once and stored using the cache processing unit 12 in preparation of operation P611. Then, all pieces of the intermediate data 15-2 in the intermediate data cache 15 are deleted by using the cache processing unit 12, and the intermediate data 15-2 obtained in operation P606 is stored.

Then, in operation P609, the analysis model general processing unit 13 determines whether there is an error with respect to operation P608. When there is an error, operation P611 is performed, and when there is no error, operation P610 is performed. Examples of the error include failure to delete the existing intermediate data 15-2, failure to store the intermediate data 15-2, and the like.

Then, in operation P610, the analysis model general processing unit 13 transmits the analysis model information 11-2 obtained in operation P601 to the reading unit 11-7. In this manner, normal processing of analysis model reading is completed.

Hereinafter, processes when an error is detected with respect to the analysis model reading process are described.

In operation P611, the analysis model general processing unit cancels the reflecting process (operation P608) of the intermediate data 15-2 so as to restore a state of the analysis model preparing system to before the analysis model reading process is started. Here, all pieces of the intermediate data 15-2 in the intermediate data cache 15 are deleted once by using the cache processing unit 12, and then the existing intermediate data 15-2 stored in operation P608 is stored in the intermediate data cache 15.

Then, in operation P612, the analysis model general processing unit 13 determines whether there is an error with respect to operation P611. When there is an error, operation P614 is performed, and when there is no error, operation P613 is performed. Examples of the error include failure to delete or store the intermediate data 15-2.

When it is determined that there is no error in operation P612, in operation P613, the analysis model general processing unit 13 notifies the reading unit 11-7 that the analysis model read request is abnormally ended. Data transmitted at this time is flag information indicating that the entire process has abnormally ended, a process result (an abnormal or normal flag) of each process stored in operations P602, P604, P607, and P609, and information of the rollback process performed in operation P611. Here, when the rollback process is not performed, the information of the rollback process is not transmitted.

When it is determined that there is an error in operation P612, in operation P614, the analysis model general processing unit 13 notifies the reading unit 11-7 that the analysis model read request is abnormally ended and the rollback process (operation P611) is failed. Data transmitted at this time is flag information indicating that the entire process has abnormally ended, flag information indicating that the rollback process has failed, a process result (an abnormal or normal flag) of each process stored in operations P602, P604, P607, and P609, and the failure of the rollback process.

As such, the analysis model preparing system 1 may normally read the analysis model information 11-2 registered in the version control system 20 into the visual programming unit 11, and at the same time, normally restore the intermediate data 15-2 used in the analysis model 1310 from the external storage 30 to the intermediate data cache 15.

Figure 10:
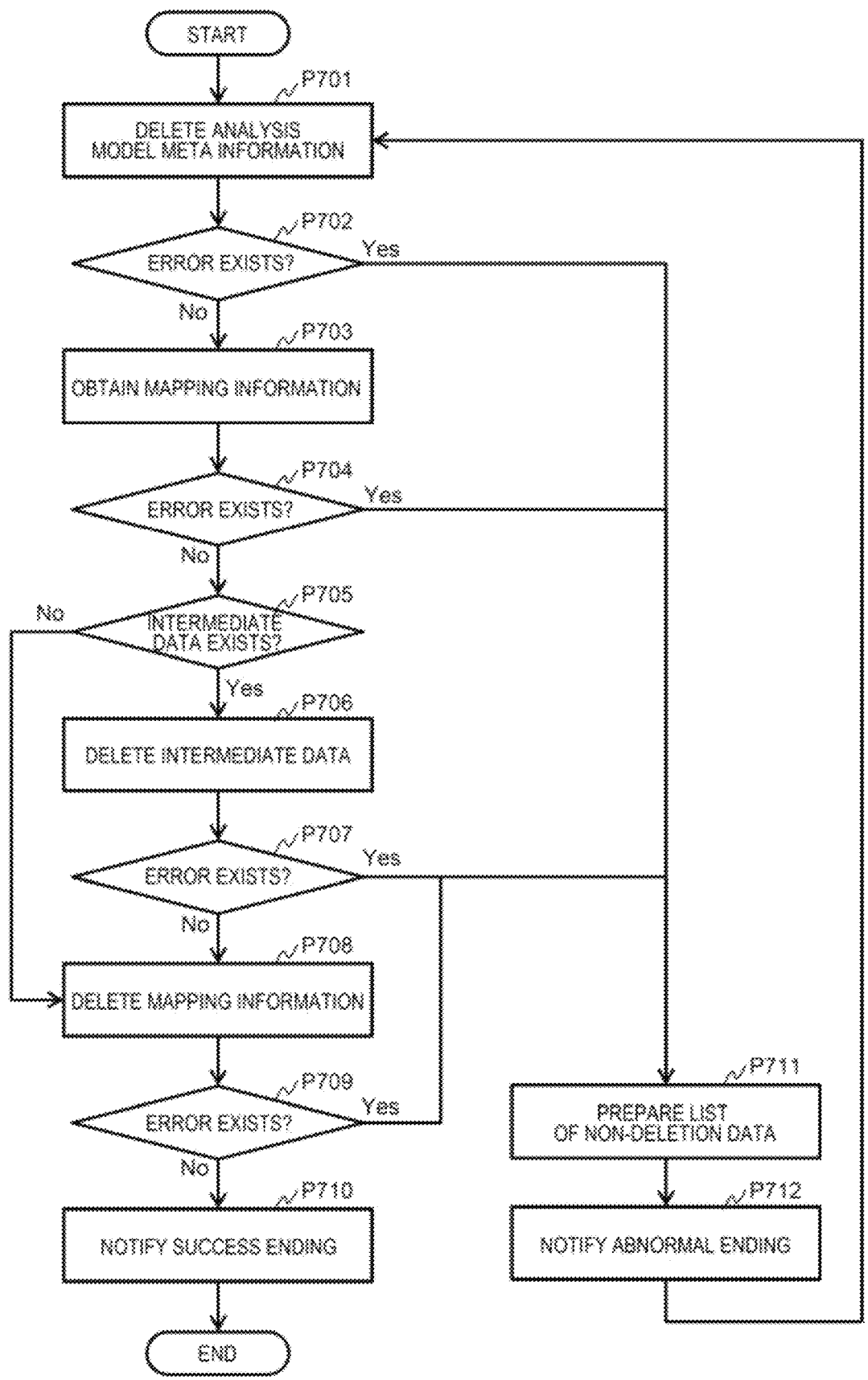
FIG. 10 is a flowchart illustrating an analysis model deleting process according to the first embodiment.

FIG. 10 is a flowchart illustrating an analysis model deleting process according to the first embodiment.

Referring to FIG. 10, in the analysis model deleting process, the analysis model information 11-2 designated by the analysis model preparer 50 is deleted from the programming apparatus 10, and the intermediate data 15-2 used in the analysis model 1310 is deleted from the external storage 30.

In the analysis model deleting process, the analysis model information 11-2 in the version control system 20 is not deleted. Accordingly, in the version control system 20, the analysis model information 11-2 is subjected to difference management, and even when difference information is left in the version control system 20, an increase in consumption of data capacity may be prevented. When the analysis model information 11-2 is deleted from the programming apparatus 10, the analysis model preparer 50 is unable to access the analysis model 1310 from the programming apparatus 10.

The analysis model deleting process is started when the reading unit 11-7 transmits an analysis model deletion request to the analysis model general processing unit 13. The analysis model deletion request includes a revision ID of the analysis model information 11-2 to be deleted.

When the analysis model deleting process is started, in operation P701, the analysis model general processing unit 13 transmits a deletion request of a record having the revision ID of the analysis model information 11-2 to a maintaining unit of the analysis model meta information 17.

Then, in operation P702, the analysis model general processing unit 13 determines whether there is an error with respect to operation P701. When there is an error, operation P711 is performed, and when there is no error, a success of operation P701 is stored and operation P703 is performed. Examples of the error include failure to access the analysis model meta information 17 and failure to delete a record of the analysis model meta information 17.

Then, in operation P703, the analysis model general processing unit 13 obtains all records having the revision ID of the analysis model information 11-2 from the mapping information 16, and obtains the intermediate data storage location 303 from each record.

Then, in operation P704, the analysis model general processing unit 13 determines whether there is an error with respect to operation P703. When there is an error, operation P711 is performed, and when there is no error, a success of operation P703 is stored and operation P705 is performed. Examples of the error include failure to access the mapping information 16, failure to obtain data from the mapping information 16, and the like.

Then, in operation P705, the analysis model general processing unit 13 determines whether the intermediate data 15-2 used by the analysis model information 11-2 exists. When the intermediate data 15-2 exists, operation P706 is performed, and when the intermediate data 15-2 does not exist, operation P708 is performed. In the determining of the existence of the intermediate data 15-2, it is determined that the intermediate data 15-2 does not exist when the intermediate data storage location 303 obtained in operation P703 is one and the content thereof is "None".

Then, in operation P706, the analysis model general processing unit 13 transmits a deletion request of the intermediate data 15-2 indicated in the intermediate data storage location 303 obtained in operation P703, to the external storage 30.

Then, in operation P707, the analysis model general processing unit 13 determines whether there is an error with respect to operation P706. When there is an error, operation P711 is performed, and when there is no error, operation P708 is performed. Examples of the error include failure to access the external storage 30, failure to delete the intermediate data 15-2 in the external storage 30, and the like.

Then, in operation P708, the analysis model general processing unit 13 transmits a deletion request of the record having the revision ID of the analysis model information 11-2 to a maintaining unit of the mapping information 16.

Then, in operation P709, the analysis model general processing unit 13 determines whether there is an error with respect to operation P708. When there is an error, operation P711 is performed, and when there is no error, a success of operation P708 is stored and operation P710 is performed. Examples of the error include failure to access the mapping information 16, failure to delete the record of the mapping information 16, and the like.

Then, in operation P710, the analysis model general processing unit 13 notifies the reading unit 11-7 that the analysis model deletion request is completed. In this manner, normal processing of analysis model deletion is completed.

Hereinafter, processes when an error is detected in the analysis model deleting process are described.

In operation P711, the analysis model general processing unit 13 prepares a list of non-deletion data based on flags in success states of processes stored in operations P702, P704, P707, and P709.

Then, in operation P712, the analysis model general processing unit 13 notifies the reading unit 11-7 that the analysis model deletion request is abnormally ended such that a deleting process is started again from operation P701. Here, when the deleting process is performed again, the list of non-deletion data prepared in operation P711 is used such that a deleting process of deleted data is skipped and only non-deletion data is deleted. Data transmitted when the abnormal ending notified includes flag information indicating that the entire process has abnormally ended, a process result (an abnormal or normal flag) of each process stored in operations P702, P704, P707, and P709, and the list of non-deletion data prepared in operation P711.

As described above, the analysis model preparing system 1 may normally delete the analysis model information 11-2 registered in the version control system 20 from the programming apparatus 10, and at the same time, normally delete the intermediate data 15-2 used in the analysis model 1310 from the external storage 30.

FIG. 11 is a diagram illustrating an example of an analysis model registering screen according to the first embodiment.

Referring to FIG. 11, when the registration form display button 801 is pressed on the GUI screen provided by the analysis model editing unit 11-4, the registration unit 11-6 displays the registration form 810.

The registration form 810 includes an analysis model name input box 811, an analysis model description input box 812, intermediate data information 813, a registration button 814, and a close button 815. Processes of generating the registration form 810 by the registration unit 11-6 will be described in detail later with reference to FIG. 13.

The analysis model preparer 50 may manage an analysis model 1310 by linking processes of the analysis model 1310 with a name or description, by inputting the name and description of the analysis model 1310 to various input boxes 811 and 812.

The intermediate data information 813 displays a list of storage names and data sizes of the intermediate data 15-2 used in the analysis model 1310, and a total value of the data sizes of the intermediate data 15-2. Accordingly, the analysis model preparer 50 may be aware of a size of a storage area consumed by the external storage 30 in advance when registering the analysis model 1310.

When the analysis model preparer 50 presses the registration button 814, the registration unit 11-6 transmits an analysis model registration request to the analysis model general processing unit 13, and the analysis model general processing unit 13 performs the analysis model registration process. In addition to the name and description of the analysis model and the total data size of the intermediate data 15-2 in the registration form 810, the registration unit 11-6 uses the analysis model information 11-2 maintained by the visual programming unit 11 as an analysis model registration request.

When the analysis model registration process is normally ended, the registration unit 11-6 displays a message of registration completion on the GUI screen. However, when the analysis model registration process is abnormally ended, the registration unit 11-6 displays, together with a message indicating that the registration process is abnormally ended, the process result (an abnormal or normal flag) of each process stored in operations P502, P504, P509, and P511, the information of the rollback process performed in operation P513, and the failure of the rollback process transmitted from the analysis model general processing unit 13, on the GUI screen. Here, when the rollback process is not failed, the failure of the rollback process is not displayed on the GUI screen.

When the analysis model preparer 50 presses the close button 815, the registration unit 11-6 does not perform the analysis model registration process, and closes the registration form 810.

Through such a screen, the analysis model preparer 50 may store the analysis model information 11-2 and the intermediate data 15-2 of the analysis model 1310 in the version control system 20 and the external storage 30, while assigning the name and description for easily handling the analysis model during storage.

Figure 12:
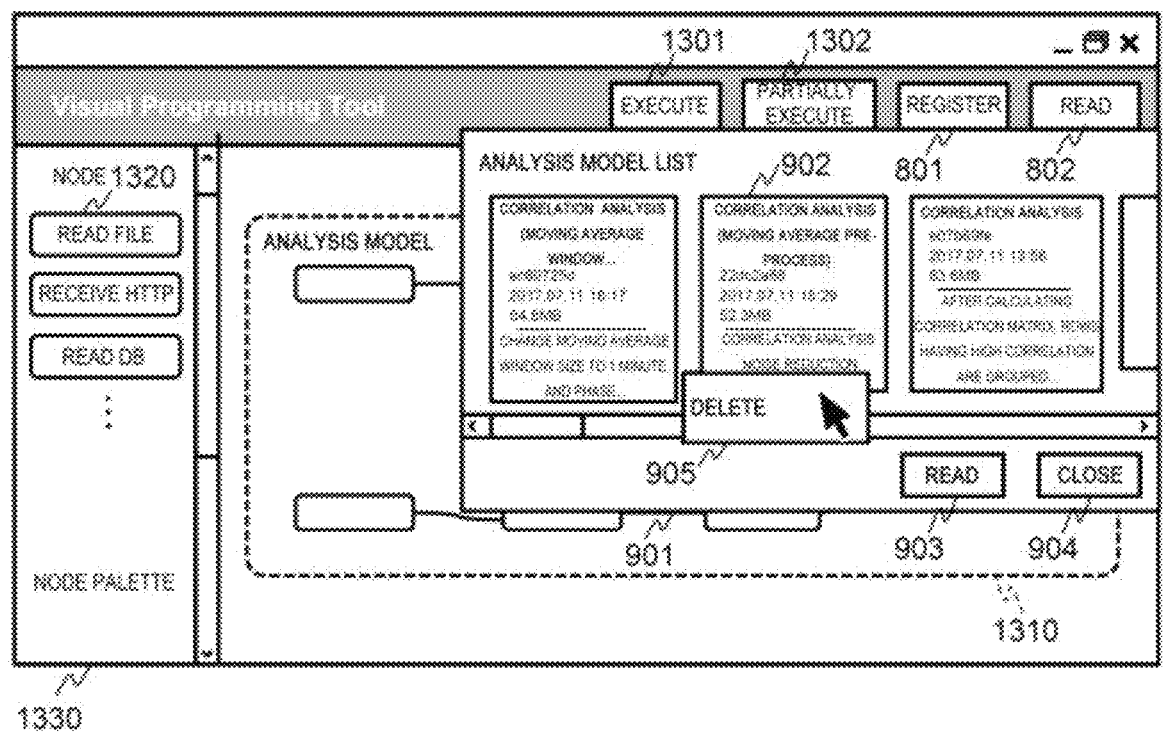
FIG. 12 is a diagram illustrating an example of an analysis model reading/deleting screen according to the first embodiment.

FIG. 12 is a diagram illustrating an example of an analysis model reading/deleting screen according to the first embodiment.

Referring to FIG. 12, when the analysis model preparer 50 presses the reading form display button 802, the reading unit 11-7 displays the reading form 901. The reading form 901 includes zero or more analysis model meta information display field 902, one read button 903, and one close button 904.

In the analysis model meta information display field 902, the analysis model name 402, the description 403, the revision ID 401, the registered time 404, and the data amount 405 registered in the analysis model meta information 17 may be displayed.

Only one analysis model meta information display field 902 may be selected via an operation of the analysis model preparer 50. The operation of the analysis model preparer 50 is, for example, a left-click or a right-click using an input device, such as a mouse or the like. When the analysis model meta information display field 902 is selected, a revision ID of the corresponding analysis model 1310 is transmitted to the reading unit 11-7.

By displaying the analysis model meta information display field 902, the analysis model preparer 50 select the analysis model 1310 to be read or deleted while checking an outline of the registered analysis model 1310.

When the read button 903 is pressed while the one analysis model meta information display field 902 is selected, the reading unit 11-7 transmits an analysis model read request to the analysis model general processing unit 13. Then, the analysis model general processing unit 13 performs the analysis model reading process. The analysis model read request includes a revision ID in the selected analysis model meta information display field 902.

When the analysis model reading process is normally ended, the reading unit 11-7 requests the analysis model editing unit 11-4 to update a screen, and the GUI screen is changed to a newly read analysis model 1310.

Meanwhile, when the analysis model reading process is abnormally ended, the reading unit 11-7 displays, together with a message indicating that the reading process is abnormally ended, the process result (an abnormal or normal flag) of each process stored in operations P602, P604, P607, and P609, the information of the rollback process, and the failure of the rollback process transmitted from the analysis model general processing unit 13, on the GUI screen. Here, when the rollback process is not failed, the failure of the rollback process is not displayed on the GUI screen.

When the close button 904 is pressed, the reading unit 11-7 does not perform the analysis model reading process, and closes the reading form 901.

Also, a delete button 905 is displayed on the analysis model meta information display field 902 according to an operation of the analysis model preparer 50. The operation of the analysis model preparer 50 is, for example, a right-click on an input device, such as a mouse, or the like. Here, the delete button 905 may be displayed on the analysis model meta information display field 902 in advance.

When the analysis model preparer 50 presses the delete button 905, the reading unit 11-7 transmits the analysis model deletion request to the analysis model general processing unit 13. Then, the analysis model general processing unit 13 performs the analysis model deleting process. The analysis model deletion request includes a revision ID of the selected analysis model meta information display field 902.

When the analysis model deleting process is ended, the reading unit 11-7 deletes the analysis model meta information display field 902 corresponding to the analysis model 1310 deleted from the reading form 901, regardless of normality or abnormality. As such, the analysis model preparer 50 may avoid an unexpected error caused by reading of the analysis model 1310 in which data is partially deleted.

Further, the reading unit 11-7 may store the revision ID of the analysis model 1310 in which the deleting process is abnormally ended such that, when the reading form 901 is generated next time, the analysis model meta information display field 902 of the analysis model 1310 that is abnormally ended is not generated. Accordingly, the analysis model preparer 50 may avoid an unexpected error caused by reading of the analysis model 1310 in which the data is partially deleted, at any timing after the deleting process is performed.

Through such a GUI screen, the analysis model preparer 50 is able to read or delete the analysis model 1310 while checking the outline of the analysis model 1310. During the reading, the intermediate data 15-2 corresponding to the analysis model 1310 is also read together with the analysis model 1310. During the deleting, the intermediate data 15-2 corresponding to the analysis model 1310 is also deleted from the programming apparatus 10 and the external storage 30, together with the unnecessary analysis model 1310.

Figure 13:
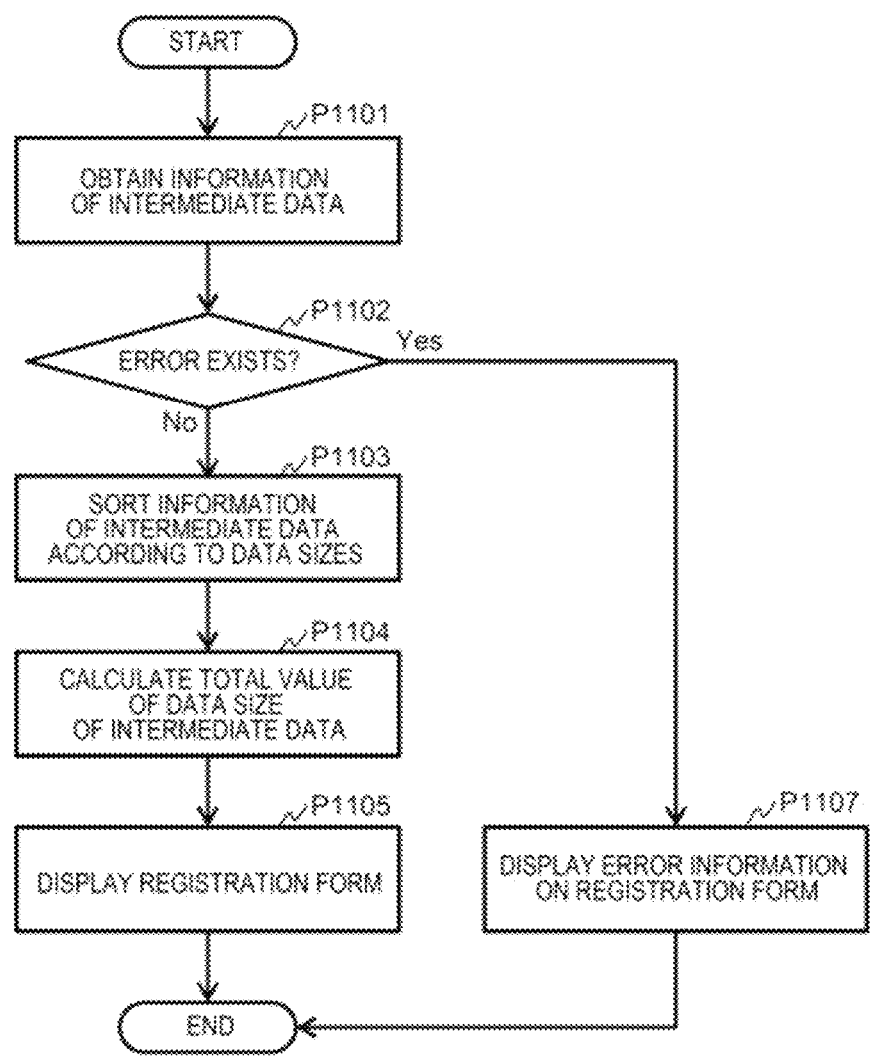
FIG. 13 is a flowchart illustrating a registration form generating process according to the first embodiment.

FIG. 13 is a flowchart illustrating a registration form generating process according to the first embodiment. In the registration form generating process, the registration unit 11-6 generates the registration form 810 when the registration form display button 801 is pressed.

Referring to FIG. 13, when a generating process of the registration form 810 is started, the registration unit 11-6 obtains the analysis model information 11-2 in operation P1101. Then, information of the intermediate data 15-2 for all nodes 1320 included in the analysis model information 11-2 is obtained by using the cache processing unit 12. The information of the intermediate data 15-2 may include the name and data size of the intermediate data 15-2. The registration unit 11-6 maintains the obtained information of the intermediate data 15-2 as, for example, a list in which information of each piece of intermediate data 15-2 is an element.

Then, in operation P1102, the registration unit 11-6 determines whether there is an error with respect to operation P1101. When there is no error, operation P1103 is performed, and when there is an error, the content of the error is stored and operation P1107 is performed. Examples of the error include failure to access the cache processing unit 12, failure of the cache processing unit 12 to obtain the information of the intermediate data 15-2, and the like.

Then, in operation P1103, the registration unit 11-6 sorts the list of information of pieces of the intermediate data 15-2 obtained in operation P1101 according to a descending order of data sizes. As a result, when the intermediate data information 813 is displayed on the registration form 810, information is displayed in an order of data sizes of the intermediate data 15-2. Thus, the analysis model preparer 50 may easily determine which intermediate data 15-2 is using large capacity. However, an order of sorting is not limited to the descending order. For example, the order of sorting may be an ascending order of data sizes, or ascending or descending order of names of intermediate data, as designated by the analysis model preparer 50.

Then, in operation P1104, the registration unit 11-6 calculates and stores a total value of the data size of each piece of intermediate data 15-2 included in the information of the intermediate data 15-2. The total value of the data size is used for the analysis model registration request, in addition to being displayed in the intermediate data information 813 of the registration form 810.

Then, in operation P1105, the registration unit 11-6 sets the information of the intermediate data 15-2 sorted in operation P1104 and the total value of the data size of the intermediate data 15-2 calculated in operation P1105 as the intermediate data information 813, and displays the registration form 810 on the GUI screen. As such, normal processing of preparing of the registration form 810 is completed.

Hereinafter, processes when an error is detected in the generating process of the registration form 810 are described.

In operation P1107, the registration unit 11-6 displays a message indicating that the preparing of the registration form 810 is failed and the content of error stored in operation P1102, on the GUI screen.

As such, the registration unit 11-6 may display the registration form 810 for registering the analysis model 1310 on the GUI screen.

Figure 14:
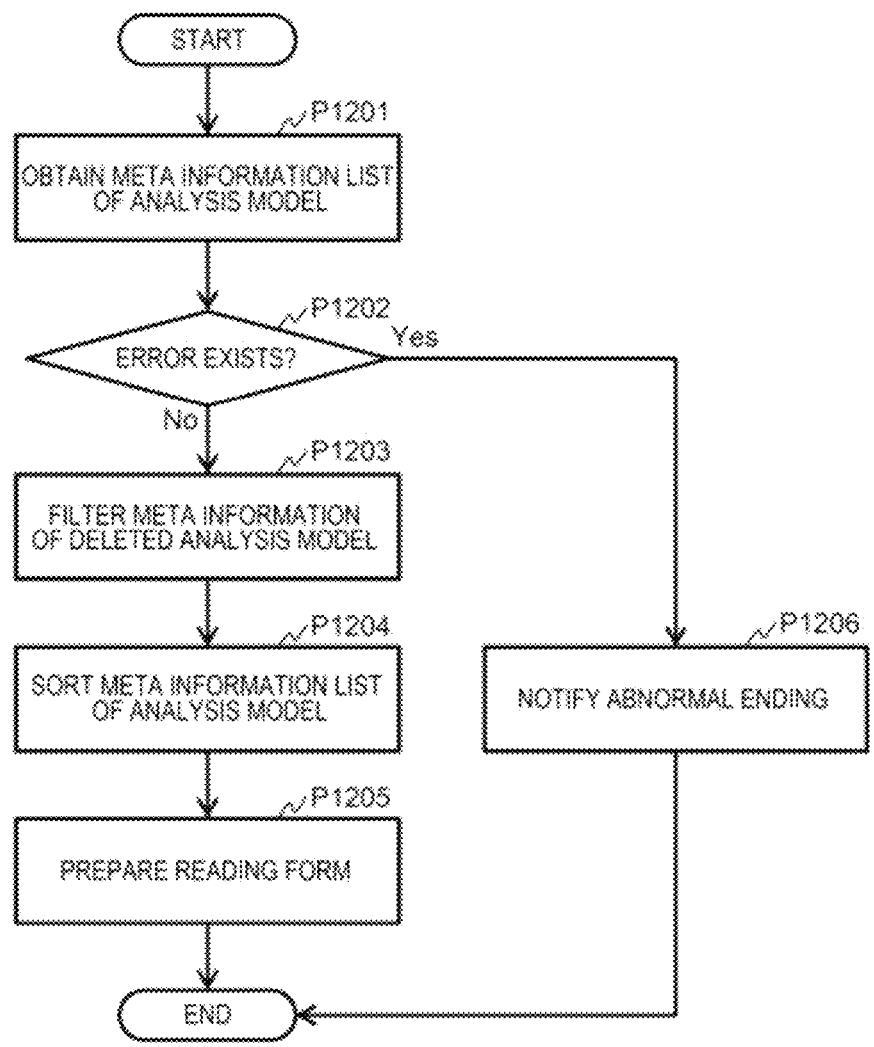
FIG. 14 is a flowchart illustrating a reading form generating process according to the first embodiment.

FIG. 14 is a flowchart illustrating a reading form generating process according to the first embodiment. In the reading form Generating process, the reading unit 11-7 displays the reading form 901 when the reading form display button 802 is pressed.

Referring to FIG. 14, when a generating process of the reading form 901 is started, in operation P1201, the reading unit 11-7 obtains all records of meta information (the revision ID 401, the analysis model name 402, the description 403, the registered time 404, and the data amount 405) of the analysis model information 11-2 included in the analysis model meta information 17, through the analysis model general processing unit 13.

Then, in operation P1202, the reading unit 11-7 determines whether there is an error with respect to operation P1201. When there is no error, operation P1203 is performed, and when there is an error, the content of the error is stored and operation P1206 is performed. Examples of the error include failure to access the analysis model general processing unit 13, failure to obtain the meta information of the analysis model 1310, and the like.

Then, in operation P1203, the reading unit 11-7 uses a list of revision IDs of the analysis model 1310 in which a deletion request is abnormally ended to exclude, from the meta information of each analysis model 1310 obtained in operation P1201, a record in which the revision ID 401 and the analysis model 1310 that is abnormally ended are matched. The list of revision IDs of the analysis model 1310 in which a deletion request is abnormally ended may be stored in the analysis model deletion request.

As a result, the analysis model preparer 50 may avoid an unexpected error caused by reading of the analysis model 1310 in which data is partially deleted, during the deleting process.

Then, in operation P1204, the reading unit 11-7 sorts the meta information of each analysis model 1310 in a descending order of registered time of the analysis model 1310. By displaying the analysis model 1310 on the reading form 901 in the descending order of registered time, the analysis model preparer 50 is able to easily check a change in the analysis model 1310. However, an order of sorting is not limited to the descending order of registered time. For example, the order of sorting may be an ascending order of data sizes, or ascending or descending order of names of the analysis model 1310, as designated by the analysis model preparer 50.

Then, in operation P1205, the reading unit 11-7 generates the analysis model meta information display field 902 from the meta information of the analysis model 1310 sorted in operation P1204. Then, the analysis model meta information display field 902 is displayed on the GUI screen as the reading form 901, together with the read button 903 and the close button 904. As such, normal processing of preparing the reading form 901 is completed.

Hereinafter, processes when an error is detected in the reading form generating process are described.

In operation P1206, the reading unit 11-7 displays a message indicating that the preparing of the reading form 901 is failed and the content of error stored in operation P1202 on the GUI screen.

As described above, the reading unit 11-7 may display the reading form 901 for reading the analysis model 1310 on the GUI screen.

Hereinafter, a flow of overall processes of the analysis model preparing system 1 of FIG. 1 will be described.

Figure 15:
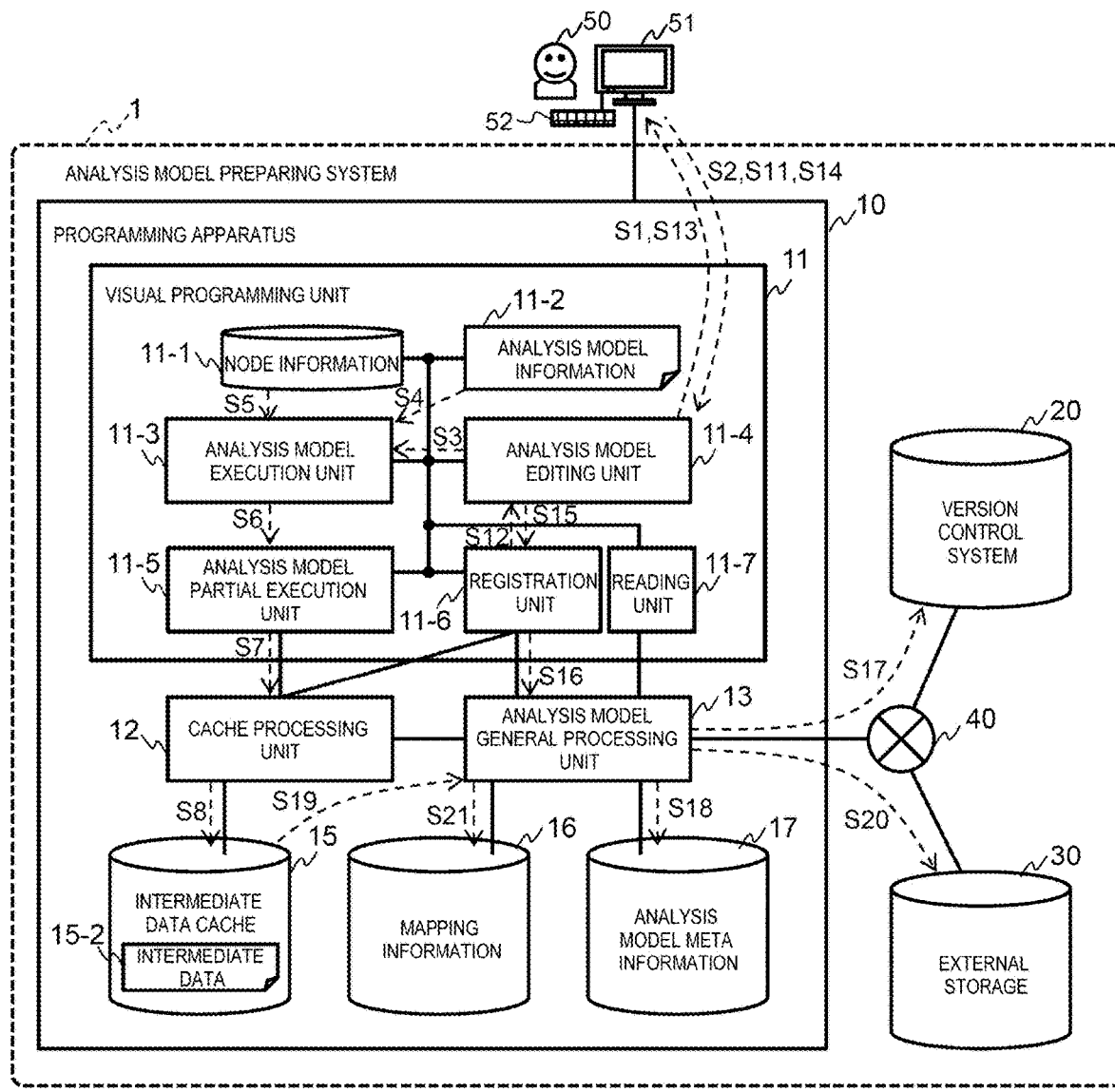
FIG. 15 is a block diagram illustrating a flow of overall processes during partial execution and registration of the analysis model preparing system of FIG. 1.

FIG. 15 is a block diagram illustrating a flow of overall processes during partial execution and registration of the analysis model preparing system 1 of FIG. 1.

Referring to FIG. 15, the analysis model editing unit 11-4 displays the GUI screen of FIG. 11 on the output device 51 (S1). Then, the analysis model preparer 50 presses the execution button 1301 by operating the input device 52 while referring to the GUI screen of FIG. 11.

When the execution button 1301 is pressed, the pressing is notified to the analysis model editing unit 11-4 (S2), and the analysis model editing unit 11-4 transmits an analysis model execution request to the analysis model execution unit 11-3 (S3). Upon receiving the analysis model execution request, the analysis model execution unit 11-3 searches the analysis model information 11-2 corresponding to the analysis model 1310 to detect the node 1320 used in the analysis model 1310 (S4). Then, the analysis model execution unit 11-3 refers to the node information 11-1 corresponding to the node 1320 (S5) to perform processes of the node 1320 defined by the node information 11-1.

Here, the analysis model execution unit 11-3 may determine a processing order of the nodes 1320 based on a connection relationship between the nodes 1320 recorded in the analysis model information 11-2. In this case, when a process of anyone node 1320 is ended, the node 1320 connected so as to receive an output of the any node 1320 may be executed.

The analysis model execution unit 11-3 caches an input value of each node 1320 as the intermediate data 15-2 through the analysis model partial execution unit 11-5, while executing each node 1320. At this time, the analysis model execution unit 11-3 transmits the node ID and the input value during execution of each node 1320 to the analysis model partial execution unit 11-5 (S6). Then, the analysis model partial execution unit 11-5 transmits the node ID and the input value during execution of each node 1320 to the cache processing unit 12, as a pair (S7). Then, the cache processing unit accesses the intermediate data cache 15 and stores the intermediate data 15-2 in a file having the node ID of each node 1320 as a file name (S8).

Then, the analysis model preparer 50 presses the registration form display button 801 by operating the input device 52 while referring to the GUI screen of FIG. 11. When the registration form display button 801 is pressed, the pressing is notified to the analysis model editing unit 11-4 (511), and the analysis model editing unit 11-4 invokes the registration unit 11-6. Then, the registration unit 11-6 displays the registration form 810 on the output device 51 through the analysis model editing unit 11-4 (S12 and S13).

Then, the analysis model preparer 50 operates the input device 52 by referring to the GUI screen of FIG. 11 to input the name, description, and the like of the analysis model 1310 on the registration form 810, and presses the registration button 814. When the registration button 814 is pressed, the pressing is notified to the analysis model editing unit 11-4 (S14), and the analysis model editing unit 11-4 invokes the registration unit 11-6. Then, the registration unit 11-6 transmits an analysis model registration request to the analysis model general processing unit 13 (S16).

Upon receiving the analysis model registration request, the analysis model general processing unit 13 registers the analysis model information 11-2 of the analysis model 1310 in the version control system 20 (S17). Further, the analysis model general processing unit 13 registers the revision ID of the analysis model 1310, the name or description of the analysis model 1310, and the like in the analysis model meta information 17, as one record (S18).

Furthermore, the analysis model general processing unit 13 obtains the intermediate data 15-2 corresponding to the node 1320 included in the analysis model 1310 from the intermediate data cache 15 through the cache processing unit 12 (S19). Then, the analysis model general processing unit 13 stores the intermediate data 15-2 in the external storage 30 (S20).

Further, the analysis model general processing unit 13 registers the revision ID of the analysis model information 11-2 of the analysis model 1310, the node ID of the node 1320 corresponding to the intermediate data 15-2, and storage location information of the intermediate data 15-2 in the external storage 30, in the mapping information 16 as one record (S21).

Figure 16:
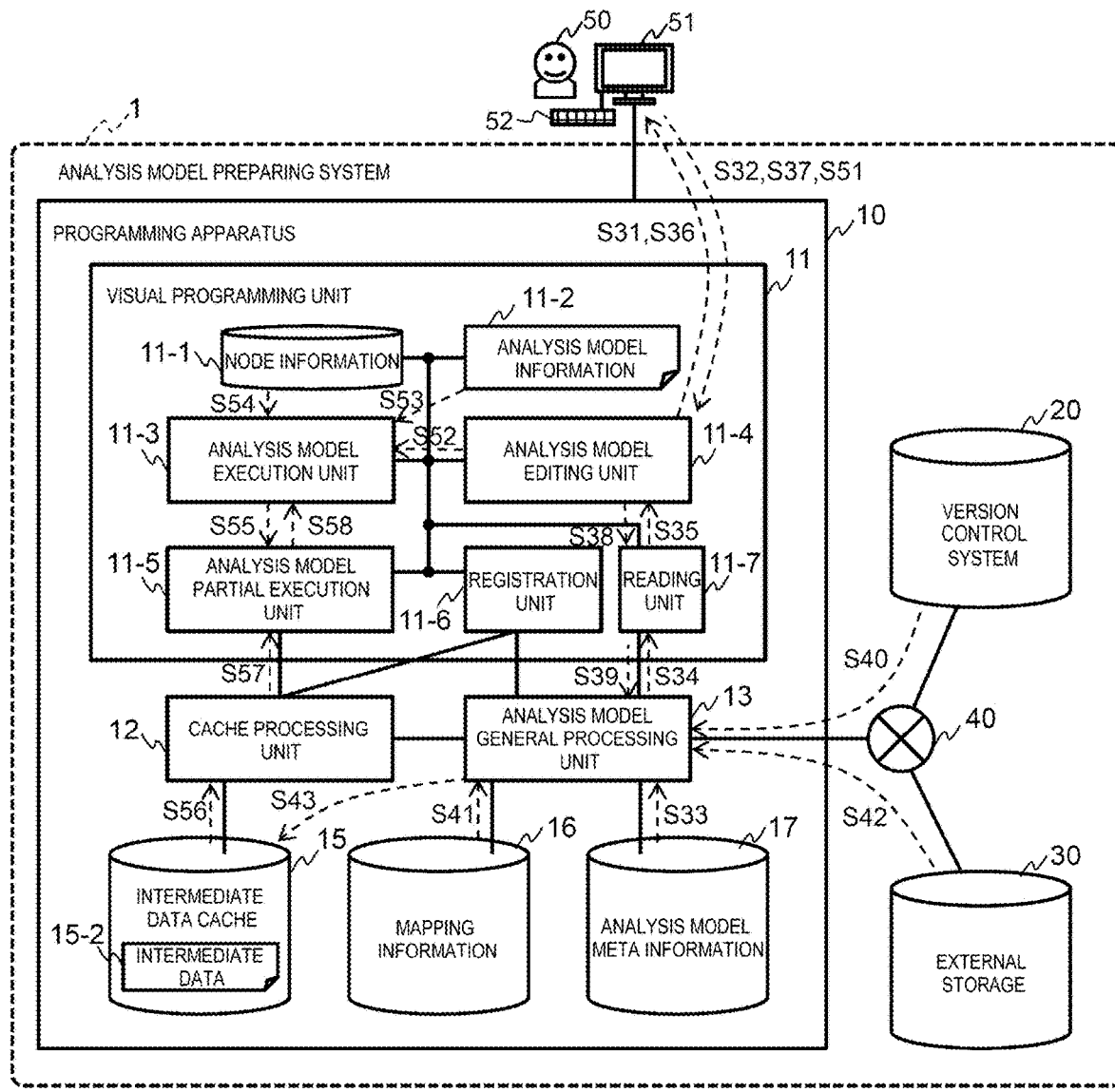
FIG. 16 is a block diagram illustrating a flow of overall processes during reading and partial execution of the analysis model preparing system of FIG. 1.

FIG. 16 is a block diagram illustrating a flow of overall processes during reading and partial execution of the analysis model preparing system of FIG. 1.

Referring to FIG. 16, the analysis model editing unit 11-4 displays the GUI screen of FIG. 12 on the output device 51 (S31). Then, the analysis model preparer 50 presses the reading form display button 802 by operating the input device 52 while referring to the GUI screen of FIG. 12.

When the reading form display button 802 is pressed, the pressing is notified to the analysis model editing unit 11-4 (S32), and the analysis model editing unit 11-4 invokes the reading unit 11-7. Then, the reading unit 11-7 reads the analysis model meta information 17 through the analysis model general processing unit 13 (S33 and S34).

Then, the reading unit 11-7 prepares the analysis model meta information display field 902 in which the name, the description, or the like of an analysis model is input per revision ID registered in the analysis model meta information 17. Then, the reading unit 11-7 prepares the reading form 901 in which the analysis model meta information display field 902 is listed per revision ID, and displays the reading form 901 on the output device 51 through the analysis model editing unit 11-4 (S35 and S36).

Then, the analysis model preparer 50 selects only one analysis model meta information display field 902 by operating the input device 52 while referring to the GUI screen of FIG. 12. When the analysis model preparer 50 presses the read button 903 while one analysis model meta information display field 902 is selected, the pressing is notified to the analysis model editing unit 11-4 (S37), and the analysis model editing unit 11-4 invokes the reading unit 11-7 (S38). Then, the reading unit 11-7 transmits an analysis model read request to the analysis model general processing unit 13 (S39). The analysis model read request includes a revision ID of the selected analysis model meta information display field 902. Here, it is assumed that the revision ID of the selected analysis model meta information display field 902 corresponds to the analysis model 1310-1.

Upon receiving the analysis model read request, the analysis model general processing unit 13 reads the analysis model information 11-2 of the analysis model 1310-1 from the version control system 20 (S40). Further, the analysis model general processing unit 13 reads the node ID 302 of the analysis model 1310-1 and the intermediate data storage location 303 from the mapping information 16 (S41).

Then, the analysis model general processing unit 13 accesses the intermediate data storage location 303 of the external storage 30 to obtain the intermediate data 15-2 from the external storage 30 (S42). Then, the analysis model general processing unit 13 stores the intermediate data 15-2 corresponding to the node 1320 included in the analysis model 1310-1 in the intermediate data cache 15 through the cache processing unit 12 (S43).

Then, the analysis model preparer 50 selects at least one node 1320 of the analysis model 1310-1 by operating the input device 52 while referring to the GUI screen of FIG. 12, and presses the partial execution button 1302. When the partial execution button 1302 is pressed while the node 1320 is selected, the pressing is notified to the analysis model editing unit 11-4 (S51), and the analysis model editing unit 11-4 transmits an analysis model partial execution request to the analysis model execution unit 11-3 (S52). Upon receiving the analysis model partial execution request, the analysis model execution unit 11-3 searches the analysis model information 11-2 corresponding to a selected range of the analysis model 1310-1 to detect the node 1320 used in the selected range of the analysis model 1310-1 (S53 and S54).

Then, the analysis model execution unit 11-3 invokes the analysis model partial execution unit 11-5 (S55). Then, the analysis model partial execution unit 11-5 reads the intermediate data 15-2 of the node 1320 used in the selected range of the analysis model 1310-1 from the intermediate data cache 15 through the cache processing unit 12 (S56 and S57).

Then, the analysis model execution unit 11-3 refers to the node information 11-1 corresponding to the node 1320 through the analysis model partial execution unit 11-5 (S58). Then, processes of each node 1320 defined in the node information 11-1 are performed by using the intermediate data 15-2 as an input value of the node 1320.

Second Embodiment

Figure 17:
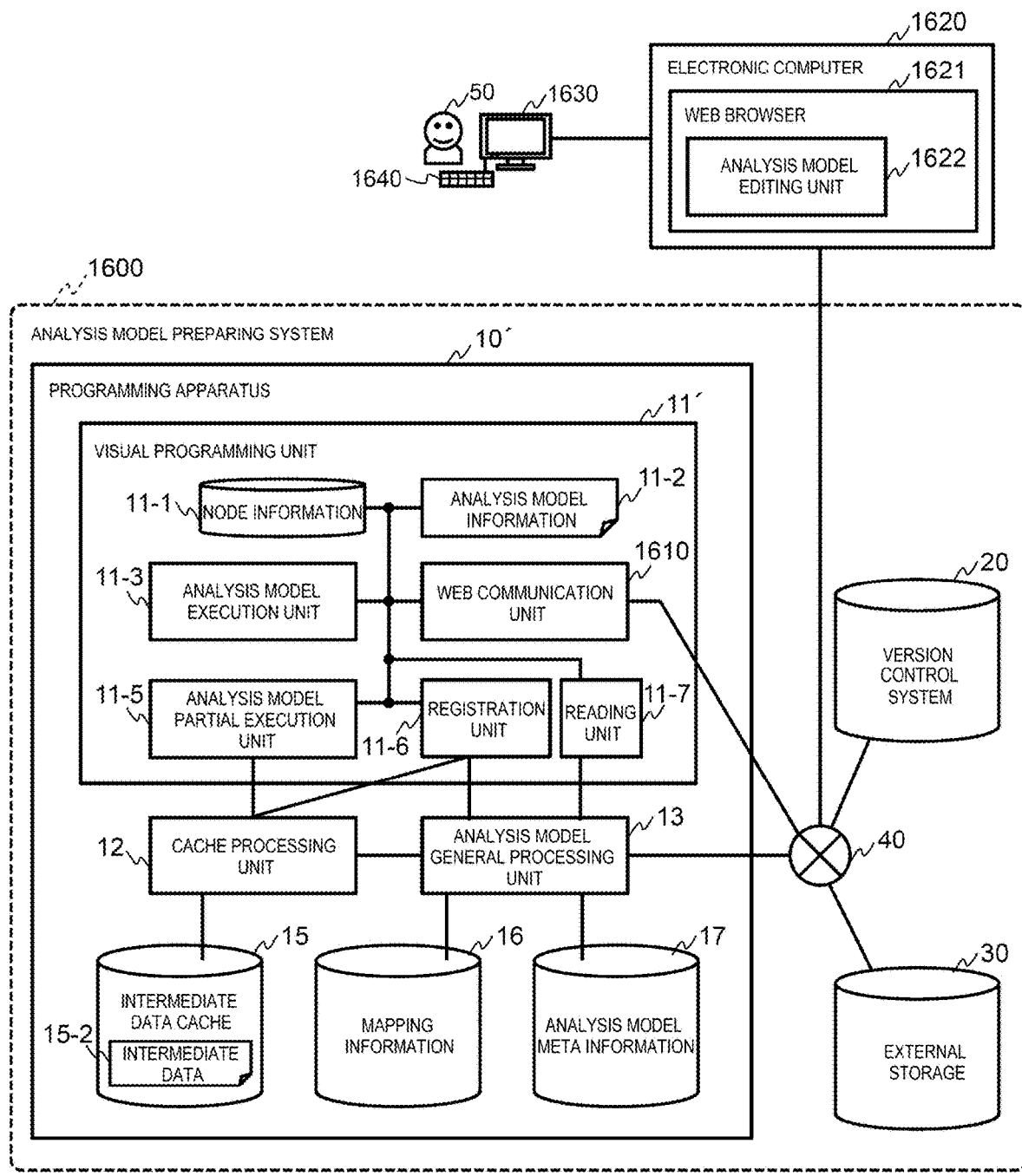
FIG. 17 is a block diagram illustrating a functional configuration of an analysis model preparing system according to a second embodiment.

FIG. 17 is a block diagram illustrating a functional configuration of an analysis model preparing system according to a second embodiment.

Referring to FIG. 17, the analysis model preparing system 1600 includes a programming apparatus 10' instead of the programming apparatus 10 of FIG. 1. The programming apparatus 10' includes a visual programming unit 11' instead of the visual programming unit 11 of FIG. 1. The visual programming unit 11' includes a web communication unit 1610 instead of the analysis model editing unit 11-4 of FIG. 1.

A web browser 1621 is provided in an electronic computer 1620. An analysis model editing unit 1622 is provided in the web browser 1621. The analysis model editing unit 1622 may operate in the web browser 1621. The electronic computer 1620 is connected to an output device 1630 and an input device 1640. Further, the electronic computer 1620 is connected to the web communication unit 1610 through the network 40.

The electronic computer 1620 may include a processor, a main storage device, an external storage device, and a communication control device. The electronic computer 1620 may be, for example, a personal computer. Alternatively, the electronic computer 1620, the output device 1630, and the input device 1640 may be a portable information terminal, such as a smart phone, or the like. The electronic computer 1620 is used by the analysis model preparer 50.

The web browser 1621 is an application operating on the electronic computer 1620. The web browser 1621 issues an HTTP request to the programming apparatus 10', and displays data obtained in response, on the output device 1630 of the electronic computer 1620. At this time, the web browser 1621 may display the analysis model editing unit 1622 on the output device 1630.

The web communication unit 1610 transmits data defining a process of the analysis model editing unit 1622 to the web browser 1621, based on the HTTP request of the web browser 1621. Then, control commands and data of various processes are related based on the HTTP request from the analysis model editing unit 1622 operating on the web browser 1621, such that various processes performed by the analysis model editing unit 11-4 with respect to the analysis model preparing system 1 are realized by the analysis model editing unit 1622 on the web browser 1621.

The analysis model editing unit 1622 is obtained by enabling the analysis model editing unit 11-4 to be operable on the web browser 1621. The analysis model editing unit 1622 may use various types of data and functions in the analysis model preparing system 1600 through the web communication unit 1610.

As described above, the analysis model preparing system 1600 may prepare the analysis model 1310 by remotely using the electronic computer 1620 as a web application.

Although the embodiments of the present invention have been described above, the present invention is not limited to the above-described embodiments, but includes various modifications and equivalent structures within the scope of the appended claims. For example, the above-described embodiments have been described in detail in order to explain the present invention in an easy-to-understand manner, and the present invention is not limited to those having all the structures described.

In the above-described embodiments, each piece of information is described in a "table" format. However, these pieces of information are not necessarily expressed by a data structure based on a table, and may be expressed by a data structure such as a list, a DB, a queue, or the like. Therefore, in order to show that it does not depend on the data structure, "table", "list", "DB", "queue" and the like are sometimes referred to as "information". Also, in describing content of each piece of information, expressions of "identification information", "identifier", and "ID (identification)" may be used, and such expressions may replace each other.

Further, in the above-described embodiments, a process performed with pressing of a button on a graphical user interface (GUI) as a starting point may be performed with invoking of an application programming interface (API) as a starting point.

Information, such as a program, a table, a file, or the like that realizes each function may be stored in a storage device, such as a memory, a hard disk, a solid state drive (SSD), or the like, or a recording medium, such as an IC card, an SD card, or a DVD, or the like.

In addition, a control line or an information line of the above-described embodiments show what is considered to be necessary for the explanation, and do not necessarily indicate all control lines and information lines necessary for mounting. In fact, it may be considered that almost all configurations are interconnected.

In addition, each of the above-described configurations, functions, processing units, processing means, and the like may be partially or entirely realized by hardware, for example, by designing an integrated circuit or the like, or may be realized by software as a processor interprets and executes a program embodiment each of the functions.

What is claimed is:

1. An analysis model preparing system that improves efficiency of executing an analysis model, the system comprising:
a memory including an intermediate cache;
a processor communicatively coupled to the memory, the processor configured to:
execute at least a part of an analysis model;
determining whether to partially execute the analysis model based on intermediate data generated during execution of the analysis model;
on a condition that the analysis model is partially executed, temporarily maintain the intermediate data in the intermediate cache;
on a condition that the intermediate data is temporarily maintained, perform reading and writing processes on the intermediate data in the intermediate cache;
on a condition that the intermediate data is read and written in the intermediate cache, maintain, as mapping information, corresponding relationship between the intermediate data and the analysis model;
store the analysis model and the intermediate data via a network;
issue a registration request of the analysis model;
issue a read request of the analysis model;
on a condition that the mapping information is maintained, generate the mapping information by associating the intermediate data with the analysis model and writing the mapping information;
based on the mapping information, read the intermediate data associated with the analysis model and write the intermediate data on the intermediate cache;
restore a state of the analysis model preparing system to a state before an error in the analysis model is detected on a condition that the error is caused by any one of: the analysis model is partially executed; the intermediate data is temporarily maintained; the intermediate data is read and written in the intermediate cache; and the mapping information is maintained; and
on a condition that the error exists, detect a restore error when the analysis model is being restored,
wherein the analysis model includes a plurality of nodes partially executing the analysis model,
the mapping information includes:
model identification information for identifying the analysis model;
node identification information for identifying a node included in the analysis model; and
storage location information of the intermediate data used in the node, and
the node identification information included in the analysis model is associated with the model identification information of the analysis model.

2. The analysis model preparing system according to claim 1, further comprising:
the processor configured to:
display an editing screen of the analysis model and edit the analysis model based on an operation result on the editing screen; and
issue a registration request of the analysis model.

3. The analysis model preparing system according to claim 2, wherein
the processor is further configured to:
provide a registration form for registering the meta information, and
provide a reading form in which the meta information is written per analysis model.

4. The analysis model preparing system according to claim 2, further comprising:
the processor is configured to communicate with a web browser via the network, and
the processor is configured to display the editing screen and edit the analysis model on the web browser.

5. The analysis model preparing system according to claim 1, wherein the processor is configured to further maintain meta information associated with the analysis model.

6. The analysis model preparing system according to claim 5, wherein
the meta information includes at least one of a name of the analysis model, a description of the analysis model, a registered time of the storing of the analysis model, or a data amount of the intermediate data.

7. The analysis model preparing system according to claim 1, wherein
the general processor is configured to delete the intermediate data associated with the analysis model based on a deletion request of the analysis model.

8. The analysis model preparing system according to claim 1, wherein
the error is an error occurring during a registration process of the analysis model.

9. The analysis model preparing system according to claim 1, wherein
the error is an error occurring during a reading process of the analysis model.

10. The analysis model preparing system according to claim 1, wherein
the error is an error occurring during a deleting process of the analysis model.

11. A programming apparatus that improves efficiency of executing an analysis model, the apparatus comprising:
a memory having an intermediate cache;
a processor communicatively coupled to the memory, the processor configured to:
determine whether to execute at least a part of an analysis model;
on a condition that the analysis model is executed, maintain, in the intermediate cache, intermediate data generated during execution of the analysis model and mapping information between the intermediate data and the analysis model;
restore a state of the analysis model preparing system to a state before an error in the analysis model is detected on a condition that the error is caused by any one of the analysis model is executed and that the intermediate data is temporarily maintained;
on a condition that the error exists, detect a restore error when the analysis model is being restored,
wherein the analysis model includes a plurality of nodes partially executing the analysis model,
the mapping information includes:
model identification information for identifying the analysis model;
node identification information for identifying a node included in the analysis model; and
storage location information of the intermediate data used in the node, and
the node identification information included in the analysis model is associated with the model identification information of the analysis model.

12. The programming apparatus of claim 11, further comprising:
the processor is configured to partially execute the analysis model based on the intermediate data associated with the analysis model.

13. The programming apparatus of claim 12, wherein
the analysis model includes a plurality of nodes partially executing the analysis model, and
the processor is configured to partially execute the analysis model by using intermediate data of each node selected from the analysis model as an input value of each node.

14. An analysis model preparing method comprising:
determining whether to execute at least a part of an analysis model;
on a condition that the analysis model is executed, maintaining, in an intermediate cache, intermediate data generated during execution of the analysis model and mapping information between the intermediate data and the analysis model; and
restoring a state of the analysis model preparing system to a state before an error in the analysis model is detected on a condition that the error is caused by any one of the analysis model is executed and that the intermediate data is temporarily maintained cause an error; and
on a condition that the error exists, detect a restore error when the analysis model is being restored,
wherein the analysis model includes a plurality of nodes partially executing the analysis model,
the mapping information includes:
model identification information for identifying the analysis model;
node identification information for identifying a node included in the analysis model; and
storage location information of the intermediate data used in the node, and
the node identification information included in the analysis model is associated with the model identification information of the analysis model.

* * * * *